(12) United States Patent
Tanno et al.

(10) Patent No.: US 8,087,164 B2
(45) Date of Patent: Jan. 3, 2012

(54) PRINTED WIRING BOARD AND A METHOD OF MANUFACTURING A PRINTED WIRING BOARD

(75) Inventors: Katsuhiko Tanno, Gifu (JP); Youichirou Kawamura, Gifu (JP)

(73) Assignee: IBIDEN Co., Ltd., Ogaki-shi (JP)

( * ) Notice: Subject to any disclaimer, the term of this patent is extended or adjusted under 35 U.S.C. 154(b) by 591 days.

(21) Appl. No.: 12/120,076

(22) Filed: May 13, 2008

(65) Prior Publication Data
US 2008/0302560 A1 Dec. 11, 2008

Related U.S. Application Data

(63) Continuation of application No. PCT/JP2007/051354, filed on Jan. 29, 2007.

(30) Foreign Application Priority Data

Jan. 27, 2006 (JP) ................................ 2006-019065

(51) Int. Cl.
*H01K 3/10* (2006.01)
(52) U.S. Cl. ................ 29/853; 29/827; 29/839; 29/840; 439/44; 439/83; 439/84; 174/283
(58) Field of Classification Search .................... 29/827, 29/829, 839, 840, 853, 739, 743, 747; 439/44, 439/66, 83, 84, 69, 70; 174/255, 264–263
See application file for complete search history.

(56) References Cited

U.S. PATENT DOCUMENTS

| | | | | |
|---|---|---|---|---|
| 6,109,507 | A | * | 8/2000 | Yagi et al. ..................... 427/97.2 |
| 6,217,987 | B1 | * | 4/2001 | Ono et al. ..................... 428/209 |
| 6,660,944 | B1 | * | 12/2003 | Murata et al. ................. 174/261 |
| 2008/0078810 | A1 | | 4/2008 | Kawamura et al. |

FOREIGN PATENT DOCUMENTS

| | | |
|---|---|---|
| JP | 4-269834 | 9/1992 |
| JP | 07-263449 | * 10/1995 |
| JP | 10-004127 | 1/1998 |
| JP | 11-204687 | 7/1999 |
| JP | 2001-210749 | 8/2001 |
| JP | 2001-267731 | 9/2001 |
| JP | 2002-151539 | 5/2002 |

* cited by examiner

*Primary Examiner* — A. Dexter Tugbang
*Assistant Examiner* — Jeffrey T Carley
(74) *Attorney, Agent, or Firm* — Oblon, Spivak, McClelland, Maier & Neustadt, L.L.P.

(57) ABSTRACT

A method of manufacturing a printed wiring board with solder bumps includes forming a solder-resist layer having small and large apertures exposing a respective conductive pad of the printed wiring board, loading a solder ball in each of the small and large apertures using a mask with aperture areas corresponding to the apertures of the solder-resist layer, forming a first bump having a first height, from the solder ball in the small aperture, and a second bump having a second height, from the solder ball in the large aperture, the first height being greater than the second height, and pressing a top of the first bump such that the first height becomes substantially the same as the second height. A multilayer printed wiring board includes a solder-resist layer with apertures of differing sizes and solder bumps having substantially equal volumes but a difference in height no greater than 10 μm.

16 Claims, 17 Drawing Sheets

Fig. 8
(A)
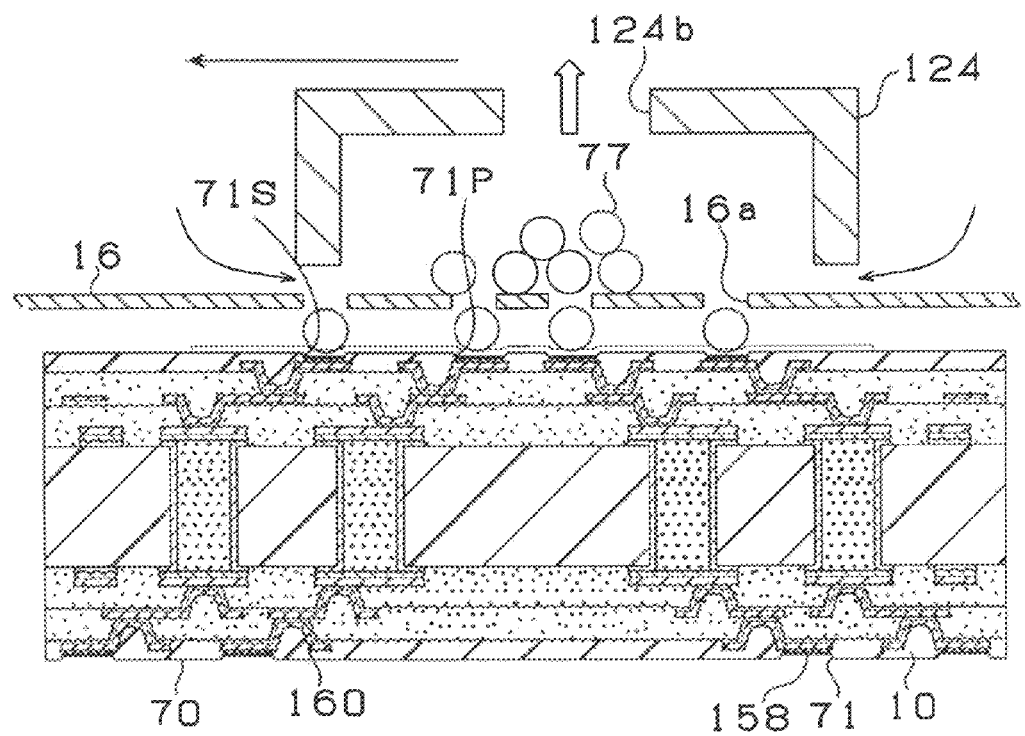
(B)
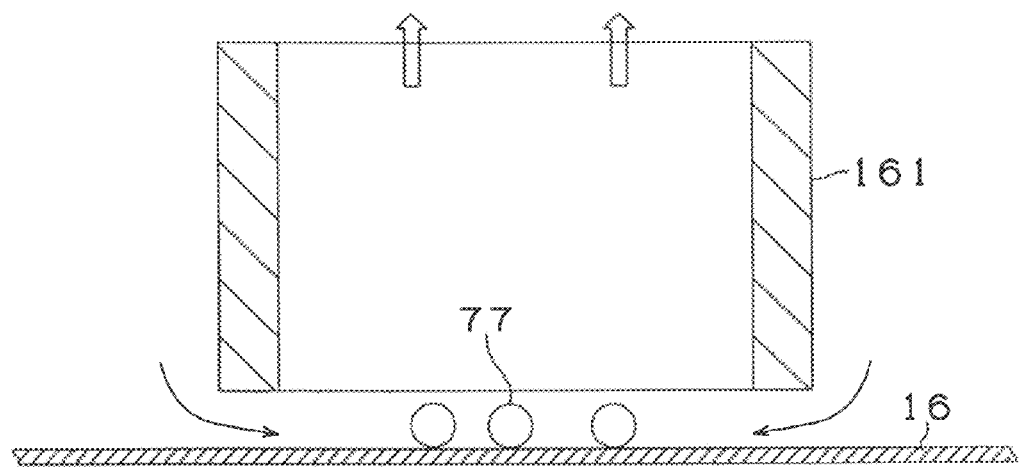

Fig. 14
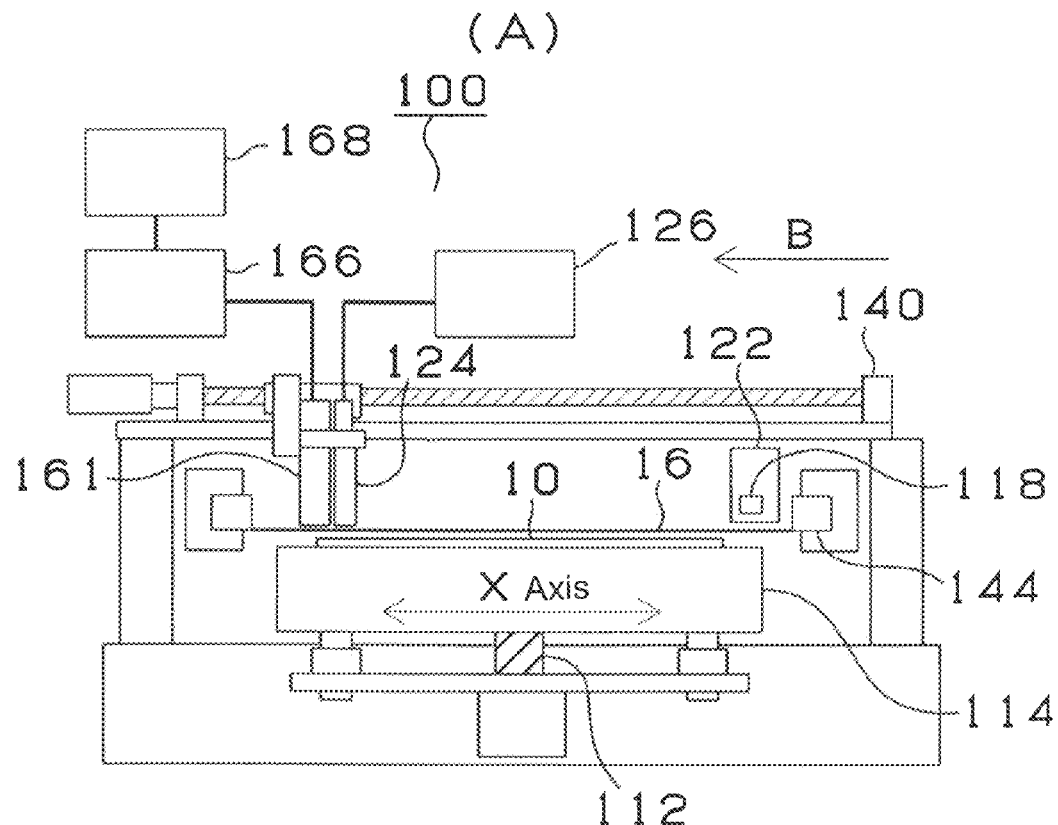
(A)
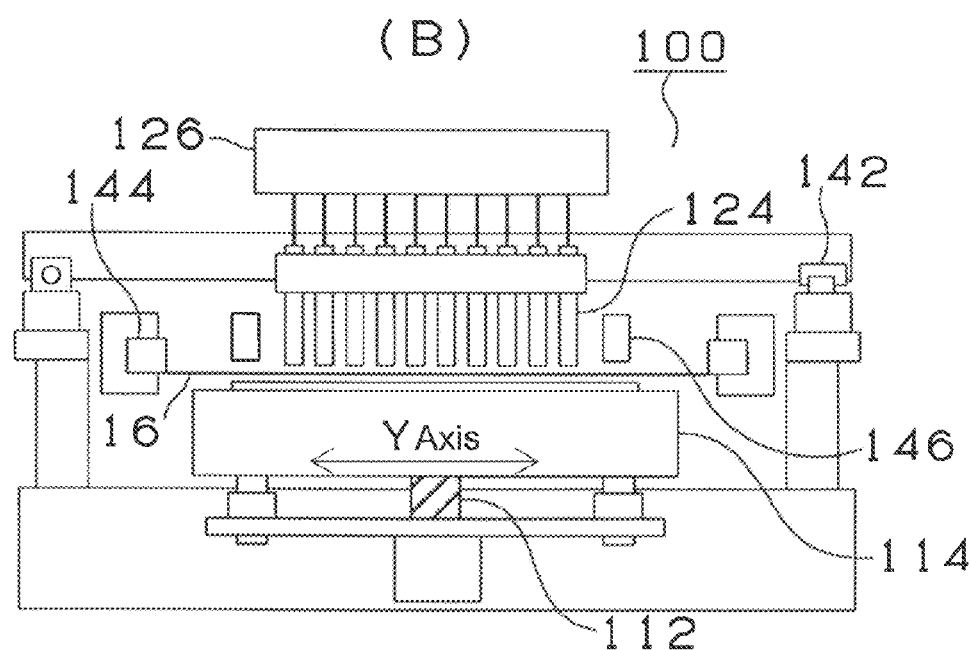
(B)

Fig. 17
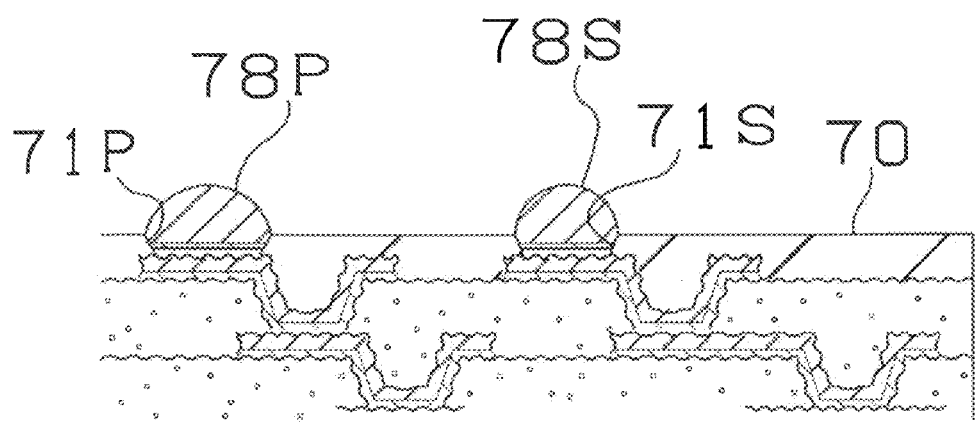
(A)
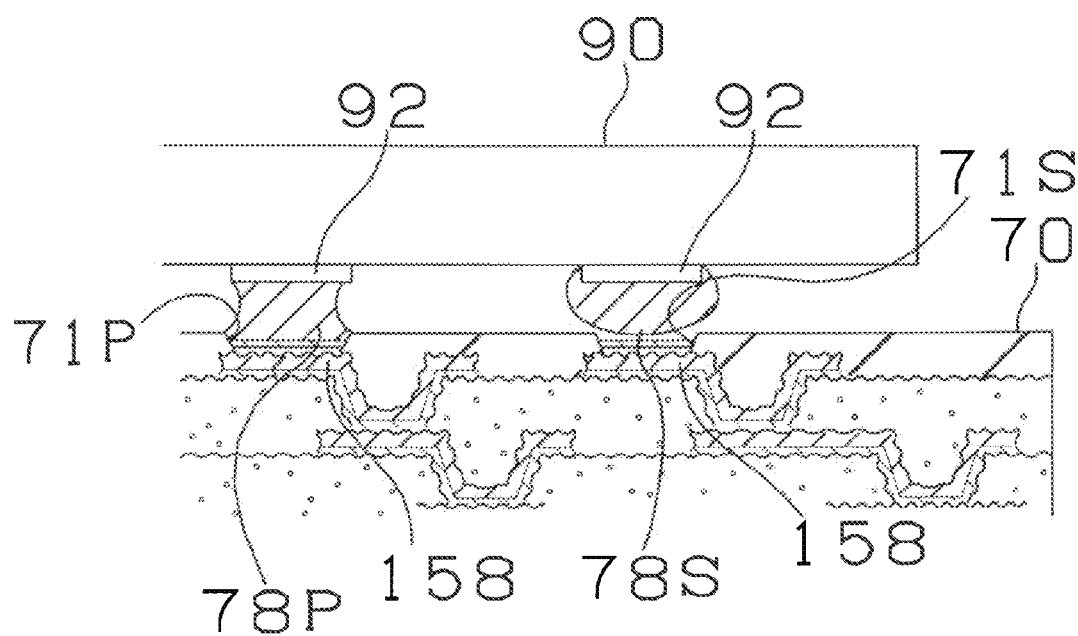
(B)

PRINTED WIRING BOARD AND A METHOD OF MANUFACTURING A PRINTED WIRING BOARD

CROSS REFERENCE TO RELATED APPLICATIONS

This application is a continuation of PCT/JP2007/051354, filed Jan. 29, 2007, which claims priority to Japanese patent application No. 2006-019065, filed Jan. 27, 2006, the entire contents of each of which is incorporated herein by reference.

BACKGROUND OF THE INVENTION

1. Field of the Invention

The present invention relates to a printed wiring board which can suitably be used for a package substrate comprising a build-up multilayer wiring board for mounting an IC chip and a method of manufacturing the printed wiring board.

2. Discussion of the Background

Solder bumps are used for an electrical connection between a package substrate and an IC chip. Solder bumps are formed with the following steps.

(1) A step of printing flux on connection pads formed in a package substrate.

(2) A step of loading solder balls on the connection pads with flux printed thereon.

(3) A step of forming solder bumps out of solder balls by reflow.

An IC chip is placed on solder bumps after the solder bumps are formed on a package substrate and the solder bumps and the pads (terminals) on the IC chip are connected by reflow such that the IC chip is mounted on the package substrate. For the above-described step of loading solder balls on connection pads, the printing technology using concurrently a ball arrangement mask and a squeegee is shown in Japanese Unexamined Patent Application Publication No. 2001-267731, the entire content of which is incorporated herein by reference.

SUMMARY OF THE INVENTION

One aspect of the present invention includes a method of manufacturing a printed wiring board having bumps. The method includes forming a solder-resist layer having a small-diameter aperture and a large-diameter aperture, each aperture exposing a respective conductive pad of the printed wiring board, loading a solder ball in each of the small-diameter aperture and the large-diameter aperture using a mask with aperture areas that correspond to the small-diameter aperture and the large-diameter aperture of the solder-resist layer, forming a first bump, having a first height, from the solder ball in the small-diameter aperture, and forming a second bump, having a second height, from the solder ball in the large-diameter aperture, where the first height is greater than the second height. The method further includes pressing a top of the first bump in the small-diameter aperture such that the first height of the first bump becomes substantially the same as the second height of the second bump. Another aspect of the invention includes a multilayer printed wiring board including a substrate with a first side, and a second side opposing the first side. The wiring board further includes a laminated structure including alternately laminated interlayer resin insulating layers and conductor layers, the laminated structure being provided on at least one of the first or second side of the substrate, and a solder-resist layer provided on an outermost layer of the laminated structure, the solder resist layer having apertures of differing sizes each exposing portions of the second conductor layer. The wiring board further includes a solder bump provided in each of the apertures, the solder bumps having substantially equal volumes but a difference in height no greater than 10 μm.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 8 shows views of a sequence of steps illustrating a method of manufacturing a multilayer printed wiring board according to an embodiment of the present invention.

FIG. 14A shows the framework of a device for mounting a solder ball related to the Embodiments of the present invention.

FIG. 14B shows the view from arrow B of the device for mounting a solder ball in FIG. 14A according to an embodiment of the present invention.

FIG. 17A is an explanatory drawing illustrating solder bumps having different diameters according to background art.

FIG. 17B is an explanatory drawing illustrating solder bumps after reflow according to background art.

DETAILED DESCRIPTION OF EMBODIMENTS

Figure 1:
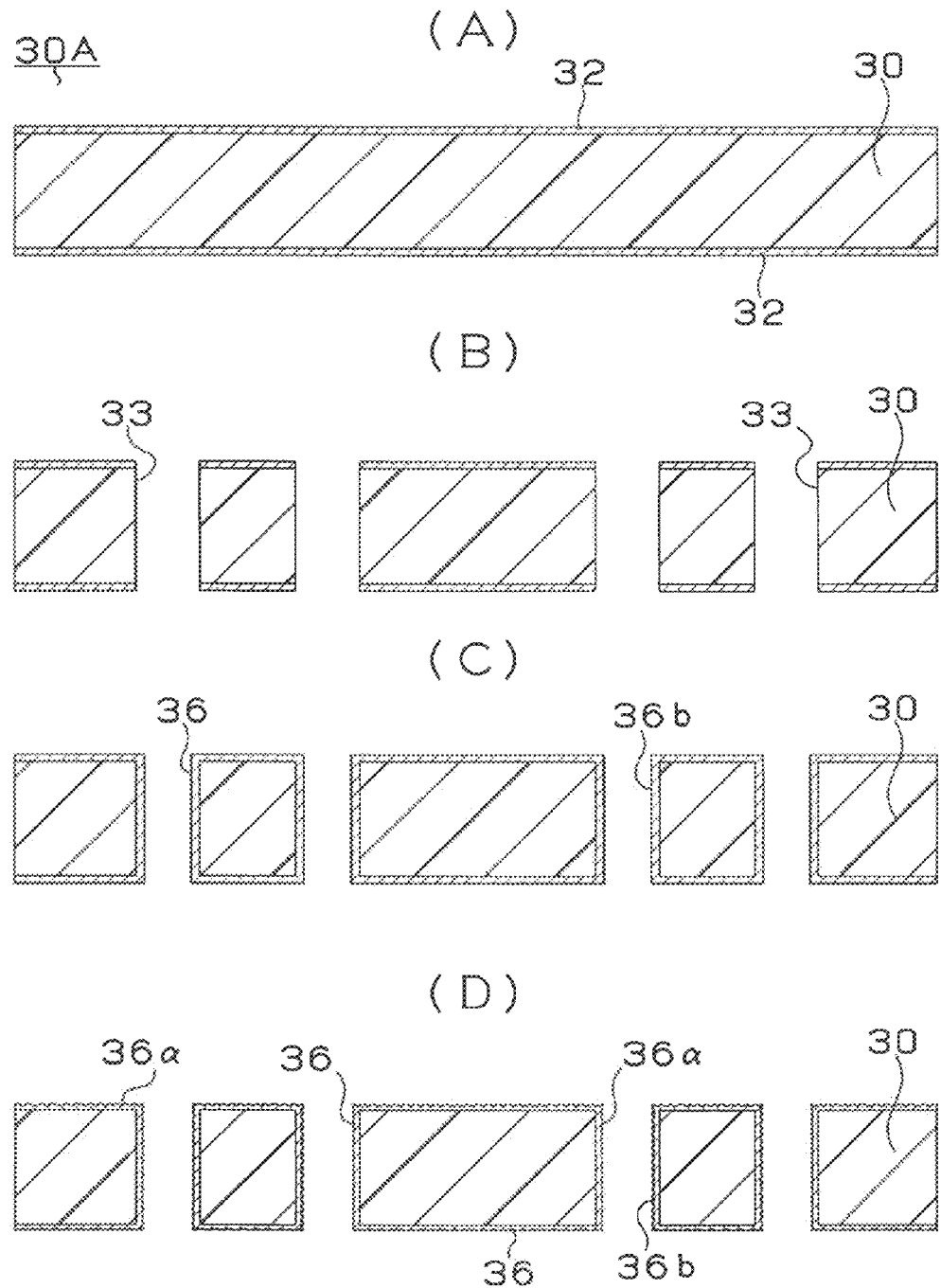
FIG. 1 shows views of a sequence of steps illustrating a method of manufacturing a multilayer printed wiring board according to an embodiment of the present invention.

Because a small-diameter solder ball can become smaller than a sand grain, for example, in the method for concomitantly using a mask for aligning a ball and a squeegee as in JP 2001-267731, the solder ball is deformed by the squeegee and the height of the solder bump can vary, resulting in quality and reliability deterioration of the end device. For example, when a solder ball becomes smaller, the ratio of the weight to the surface area decreases and an attraction phenomenon occurs to the solder ball due to the intermolecular force thereby causing the solder balls to easily stick or cling together. In the related art, because solder balls that stick or cling together come in contact with a squeegee, the solder balls are damaged and partially defected. If the solder ball is partially defected, the volume of the solder bump becomes different on each joint pad and the height of the solder bump varies as mentioned above. With high speed IC chips, there has been a demand for larger diameters for the bumps constituting power supply lines and ground lines so as to be capable of conducting large electrical currents, and, conversely, with highly integrated IC chips there has been a demand for small diameters for the pads and bumps constituting signal lines. Accordingly, the present applicant conducted studies on a provision for power supply and ground of large-diameter opening solder bumps 78P (solder volume being large) in large-diameter openings 71P and on a provision for signal line of small-diameter opening solder bumps 71S (solder volume being small) in the small-diameter openings 71S in the solder-resist layer 70, as illustrated in FIG. 17 (A). However, it was learned that with the structure illustrated in FIG. 17 (A), the solder constituting the small-diameter opening solder bump 78S flows out to the pad 92 side on the IC chip 90 when an IC chip is mounted, as illustrated in FIG. 17 (B), such that there occurs a disconnection between the pad 92 on the IC chip and the pad 158 on the printed wiring board.

One of the objectives for the present invention is to provide a printed wiring board and a method of manufacturing the printed wiring board whereby bumps can be formed in roughly the same height on the connection pads (conductor circuits exposed out of the solder-resist layer and varying in size) having varying opening diameters in the solder-resist. And another objective is to provide a printed wiring board and a method of manufacturing the printed wiring board having a high mountability yield and connection reliability after the mounting.

One embodiment of the invention includes a method of manufacturing a printed wiring board with solder bumps including at least the following steps (a) through (d):

(a) a step of forming a solder-resist layer having small-diameter openings and large-diameter openings exposing connection pads;

(b) a step of loading, with the use of a mask provided with opening portions corresponding to the small-diameter openings and large-diameter openings in the above-described solder-resist layer, metal balls having a low melting point in said small-diameter openings and large-diameter openings;

(c) a step of forming by reflow bumps having a high height out of the metal balls having a low melting point in the above-described small-diameter openings and bumps having a low height out of the metal balls having a low melting point in the above-described large-diameter openings; and (d) a step of pressing from the top on the bumps having a high height in the above-described small-diameter openings such that the height thereof is nearly the same as that of the bumps having a low height in the above-described large-diameter openings.

According to another embodiment of the invention, a multilayer printed wiring board on a core substrate has through-hole conductors penetrating the front face and the rear face, and there are alternately laminated interlayer resin insulating layers and conductor layers. Via-hole conductors connect a conductor layer to another conductor layer. A solder-resist layer is provided on the outermost layer. A portion of the conductor layer is exposed from an opening in the solder-resist layer, constituting a pad to mount an electronic part, and solder bumps are formed on these pads.

The above-described openings have different apertures. Some have small-diameter apertures having a relatively small diameter and some have large-diameter apertures having a relatively large diameter.

The solder bumps formed in said small-diameter apertures and the solder bumps formed in the above-described large-diameter apertures are adjusted such that they are approximated to each other in height by the solder bumps formed in the above-described small-diameter apertures and in the above-described large-diameter apertures having the same volume and by the solder bumps formed in the above-described small-diameter apertures by being flattened.

With the use of a mask, metal balls having a low melting point, of substantially equal volume, are loaded into the large-diameter apertures and the small-diameter apertures in the solder-resist layer. Bumps having a high height are formed out of metal balls having a low melting point in the small-diameter apertures in the solder-resist layer and bumps having a low height are formed out of metal balls having a low melting point in the large-diameter apertures in the solder-resist layer. Then, the bumps having a high height in the small-diameter apertures are pressed down from the top such that they are made nearly the same in height as the bumps having a low height in the large-diameter apertures. Accordingly, even when solder-resist aperture diameters to expose connection pads vary, bumps can be formed in nearly the same height. Since the bumps in the small-diameter apertures have the same volume of the metal having a low melting point as the bumps in the large-diameter apertures, the chance of non-connection at the bumps in the small-diameter apertures when an IC chip is loaded via the bumps in the small-diameter apertures and the bumps in the large-diameter apertures is reduced, increasing the connection reliability between the IC chip and the printed wiring board.

According to yet another embodiment, the metal balls having a low melting point are gathered with the use of a mask provided with aperture portions corresponding to the apertures in the solder-resist layer and a cylinder member located above said mask. Air is sucked in from said cylinder member, such that the metal balls are gathered directly below the cylinder member. By the above-described cylinder member or the printed wiring board and the mask being moved relative to each other in a horizontal direction, the gathered metal balls are dropped into the small-diameter apertures and large-diameter apertures of the solder-resist layer via the aperture portions of the mask. Accordingly, this enables fine metal balls having a low melting point to be loaded with certainty and accuracy in all (or essentially all) the apertures of the solder-resist layer. Because the metal balls are moved without being contacted by a moving member such as a squeegee, the metal balls can be loaded in the small-diameter apertures and large-diameter apertures without being damaged and deformed, allowing the height of the resulting bumps to be uniform. Further, this enables metal balls having a low melting point to be properly placed in the apertures even on a printed wiring board with a largely irregular or undulated surface such as a built-up multilayer wiring board.

By flattening the solder bumps formed in the small-diameter apertures, the height of the solder bumps in the small-diameter apertures and the height of the solder bumps in the large-diameter apertures are approximately equal to each other even when the same volume metal balls are used in different apertures. Thus, there occurs minimal non-connection at the solder bumps in the small-diameter apertures when an IC chip is loaded via the solder bumps in the small-diameter apertures and the solder bumps in the large-diameter apertures, allowing the connection reliability between the IC chip and the printed wiring board to be ensured.

According to yet another embodiment, pads for power supply and ground connections are formed in large-diameter apertures and mainly disposed on the center area of the printed wiring board such that the length of the wiring is short resulting in lower resistance value so that the voltage drop is minimized during a sudden increase in power consumption to prevent the IC chip from malfunctioning. Further, because the solder bumps formed in the large diameter apertures are not flattened but maintain in a semi-spherical shape, voids can easily be let out in reflow when the IC chip is loaded. Thus the resistance value of the connection can be prevented from being elevated due to the formation of voids. Conversely, by forming pads for signal in small-diameter apertures, wiring density can be enhanced and concurrently by said small-diameter apertures being mainly disposed on the outer area the printed wiring board, where the large-diameter apertures are on the center area, the solder bumps in said small-diameter apertures are flattened with a flattening plate material having aperture portions corresponding to the sites where the large-diameter apertures are formed, so that the large aperture bumps are not pressed by the flattening plate.

According to yet another embodiment, when solder-resist aperture diameters vary, by flattening the solder bumps formed in small-diameter apertures, the solder bumps in the small-diameter apertures and the solder bumps in large-diameter apertures are approximated to the height of 10 µm and have the same volume. Since the solder bumps in the small-diameter apertures are the same in volume with the solder bumps in large-diameter apertures, there occurs no non-connection at the solder bumps in small-diameter apertures when an IC chip is loaded via the solder bumps in small-diameter apertures and the solder bumps in large-diameter apertures allowing the connection reliability between the IC chip and the printed wiring board to be ensured.

FIG. 14(A) shows the framework of a device for mounting a solder ball related to one example of the embodiments in the present invention, and FIG. 14 (B) shows the view from arrow B of the device for mounting a solder ball in FIG. 14 (A). For example, the device of FIGS. 14A and 14B may be used to mount a small solder ball 77 (less than 200 µm in diameter) on a joint pad of the multilayered printed wiring board.

A device for mounting a solder ball 100 comprises: a XYθ suction table 114 that holds the positioning of a multilayered printed wiring board 10, a vertically moving axis 112 that moves said XYθ suction table 114 up and down, and a mask for aligning a ball 16, the mask comprising an aperture that corresponds to a joint pad of the multilayered printed wiring board. Also included is a mount cylinder (cylindrical member) 124 that guides a solder ball moving on the mask for aligning a ball 16, a suction box 126 that provides negative pressure on the mount cylinder 124, a cylinder for removing absorbed balls 161 to collect redundant solder balls, and a suction box 166 that provides negative pressure on said cylinder for removing absorbed balls 161. Also included is a suction device for removing absorbed balls 168 that holds the collected solder balls, a mask clamp 144 that clamps the mask for aligning a ball 16; and a moving axis in the X direction 140 that sends the mount cylinder 124 and the cylinder for removing absorbed balls 161 in an X direction. In one embodiment, the clamp 144 may be fixed to the table 114 such that the mask moves with the table when the table is movable. Further included in the embodiment of FIGS. 1A and 1B is a support guide for the moving axis 142 that supports the moving axis in an X direction 140, an alignment camera 146 that images a multilayered printed wiring board 10, a sensor for detecting remaining quantity 118 that detects the remaining quantity of solder balls under the mount cylinder 124, and a feeding device for solder balls 122 that feeds solder balls to the mount cylinder 124 according to the remaining quantity detected by the sensor for detecting remaining quantity 118.

Figure 12:
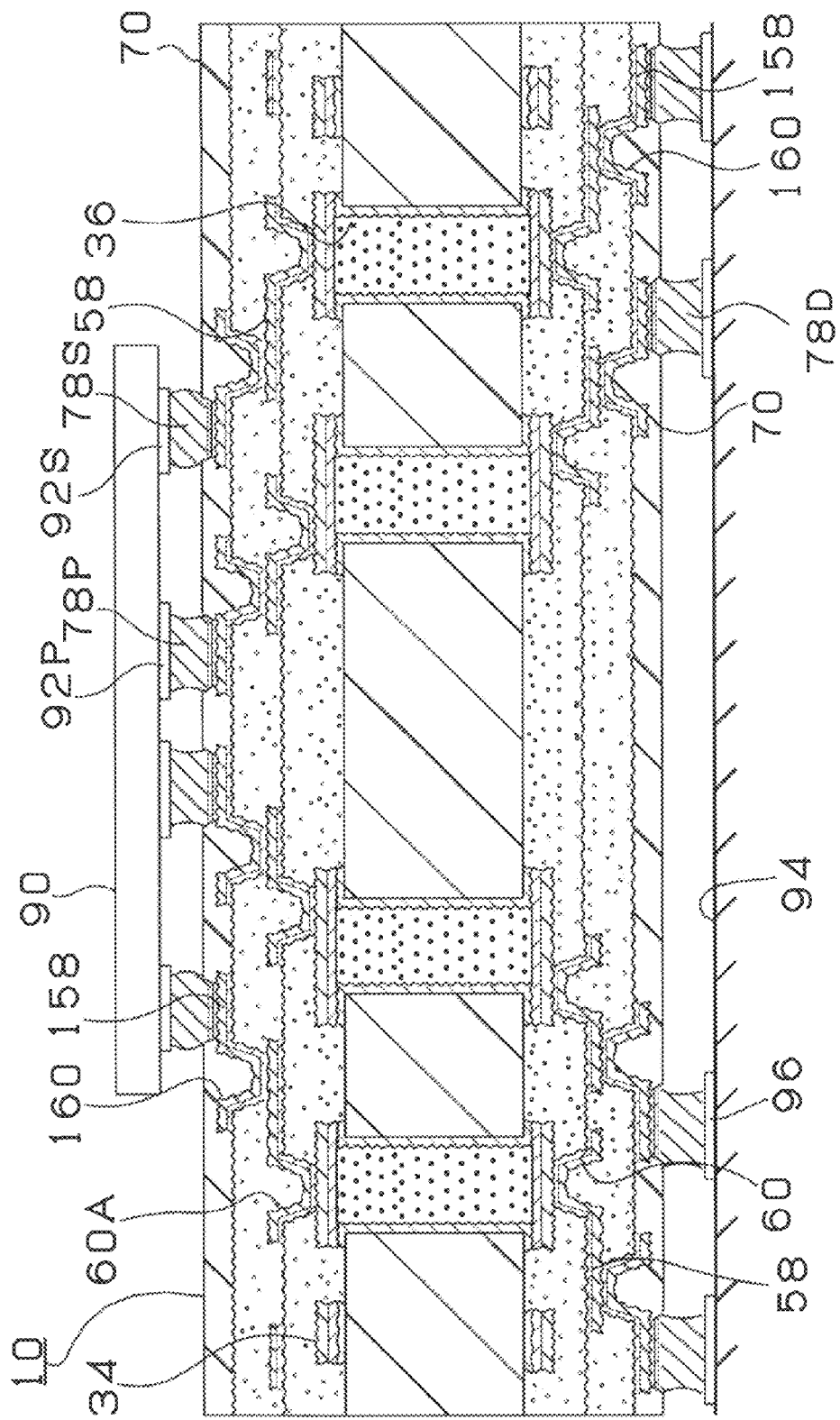
FIG. 12 is a cross-sectional view of a state in which an IC chip is placed on the multilayered printed wiring board in FIG. 11.
Figure 13:
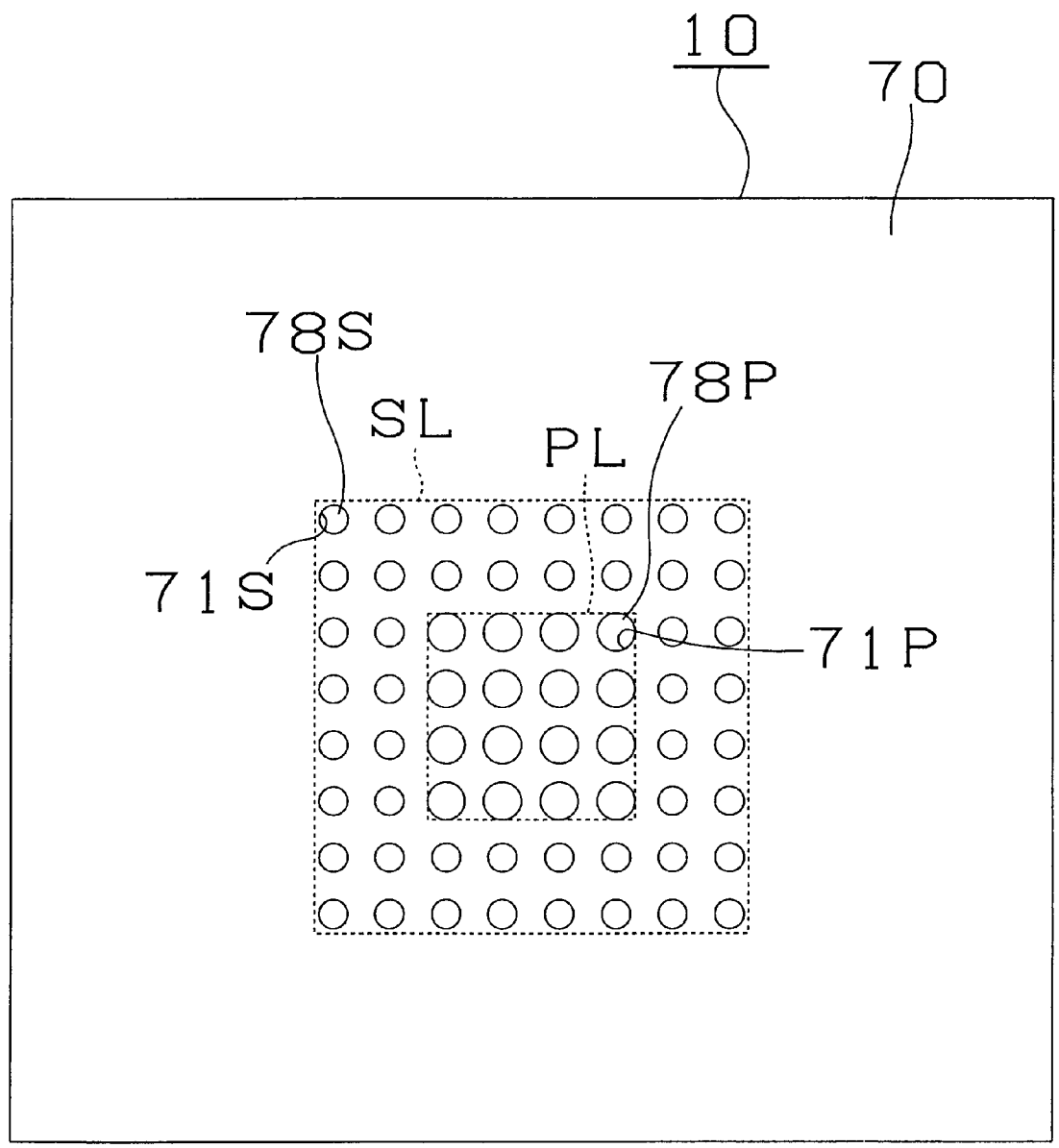
FIG. 13 is a plan view of a multilayer printed wiring board related to an embodiment of the present invention.

Next, with reference to FIG. 1 to FIG. 13, the constitution of the multilayered printing wiring board 10 related to embodiments of the present invention is explained. FIG. 11 illustrates a sectional view of said multilayer printed wiring board 10, and FIG. 12 the condition in which the multilayer printed wiring board illustrated in FIG. 11 has an IC chip 90 attached thereto, which is placed on a daughter board 94. FIG. 13 illustrates a plan view of the multilayer printed wiring board 10 prior to an IC chip being attached. FIG. 11 and FIG. 12 show illustratively with the numbers of solder bumps 78P and solder bumps 78s illustrated in FIG. 13 being reduced. In addition, on an actual package substrate hundreds of solder bumps 78P and solder bumps 78S are provided.

As shown in FIG. 11, with respect to the multilayer printed wiring board 10, conductive circuits 34 are formed on the surfaces of a core substrate 30. The top face and the bottom face of the core substrate 30 are connected via through holes 36. On the core substrate 30 are provided interlayer resin insulating layers 50, having via holes 60 and conductor circuits 58 formed thereon, and interlayer resin insulating layers 150, having via holes 160 and conductor circuits 158 formed thereon. On said via holes 160 and conductor circuits 158 are formed solder-resist layers 70. In the solder-resist layers 70 are formed large-diameter (D1=105 µm in diameter) apertures 71P and small-diameter (D2=80 µm in diameter) apertures 71S, and there are provided solder bumps 78P for power supply and ground on pads 73P in the large-diameter apertures 71P and solder bumps 78S for signal on pads 73S in the small-diameter apertures 71S. The solder bumps for power supply and ground 78P and the solder bumps for signal 78S are constituted out of solder balls having the same volumetric displacement as described below, such that they have the same volume. The height H1 of the large-diameter solder bumps 78P is set to about 30 µm and the height H2 of the small-diameter solder bumps 78S is set by being flattened to about 30 µm, which is the same as the height of the large-diameter solder bumps 78P. Many of the large-diameter solder bumps for power supply and ground 78P are disposed closer toward the center of the multilayer printed wiring board, such that the wiring distance would be short, and the small-diameter solder bumps for signal 78S are disposed relatively lopsidedly on the outer side of the large-diameter solder bumps 78P. On the lower face side of the multilayer printed wiring board are formed solder bumps 78D via the apertures of said solder-resist layer 70. In addition, while in FIG. 11 the apertures in the solder-resist are formed such that a portion of the conductor circuits 158 is exposed, the apertures may be formed such that they include only via holes 160 or via holes 160 and a portion of the conductor circuits 158.

As shown in FIG. 12, the solder bumps for power supply and ground 78P on the upper face side of the multilayer printed wiring board 10 are connected to the electrodes for power supply and ground 92P of an IC chip 90 and the small-diameter aperture solder bumps 78S to the electrodes for signal 92S. On the other hand, the solder bumps 78D on the lower side are connected to the lands 96 of the daughter board 94.

As shown in FIG. 13, a plan view of the multilayer printed wiring board prior to an IC chip being mounted, the multilayer printed wiring board 10 has pads for power supply and ground 78P formed in large-diameter apertures 71P and mainly disposed on the center area (the area inside the dotted lines PL) of the multilayer printed wiring board 10. This way the length of the wiring from the IC chip 90 to the daughter board 94 is short and the resistance is reduced. Thus, a drop in supply voltage is minimized when there is a sudden increase in consumed power by the IC chip to prevent the IC chip 90 from malfunctioning. Conversely, wiring density is increased by pads for signal 78S disposed inside the area indicated by the broken lines SL being formed in the small-diameter apertures 71S.

With highly integrated IC chips, there has been a demand for the apertures in the solder-resist for the signal line of the package substrate to be smaller in diameter and narrower in pitch. Conversely, in order to be able to handle a sudden increase in power consumption by the IC chip, an extremely small diameter of the solder bumps for power supply and ground on the package substrate is not desired. Namely, a small diameter of the solder bumps made of a solder alloy leads to a high resistance value causing a voltage drop when there is a sudden increase in power consumption causing the IC chip to malfunction. A solution to satisfy this mutually conflicting requirement is for the solder-resist apertures for signal to be of a small diameter and for the solder bumps for power supply and ground to be of a large diameter.

Continuously, with reference to FIG. 1 through FIG. 6, the method of manufacturing the aforementioned multilayer printed wiring board 10, that was mentioned above with reference to FIG. 11, is explained.

A copper-foil laminated board 30A, wherein a copper foil being 5 to 250 μm is laminated on both faces of an insulation substrate made of a glass-epoxy resin or a BT (bismaleimide triazine) resin 0.2 to 0.8 mm in thickness, was used as a starting material (FIG. 1 (A)). First, this copper-clad laminated board was drilled to bore through holes 33 (FIG. 1 (B)), which was electroless-plated and electroplated to form sidewall conductor layers 36b of the through holes 36 (FIG. 1 (C)).

(2) Next, the substrate 30 having through holes 36 formed therein is washed with water and dried. Then the substrate 30 undergoes a blacking process with an aqueous solution containing NaOH (10 g/l), NaClO$_2$ (40 g/l), and Na$_3$PO$_4$ (6 g/l) as a blacking bath (an oxidation bath) and a reduction process with an aqueous solution containing NaOH (10 g/l) and NaBH4 (6 g/l) as a reduction bath to form roughened faces 36α on the side-wall conductor layers 36b of the through holes 36 and the surfaces (FIG. 1 (D)).

(3) Next, the through holes 36 are filled with a filler 37 containing copper particles of the average particle diameter being 10 μm (for example, a non-conductive plugging copper paste made by Tatsuta Electric Wire & Cable Co., Ltd., Product Name: DD PASTE) with screen printing, which is dried and hardened (FIG. 2 (A)). This is performed such that a coating is given with a printing method on the substrate with a mask placed thereon and provided with apertures at the through hole portions to be filled in the through holes, and following the filling it is dried and hardened.

Figure 2:
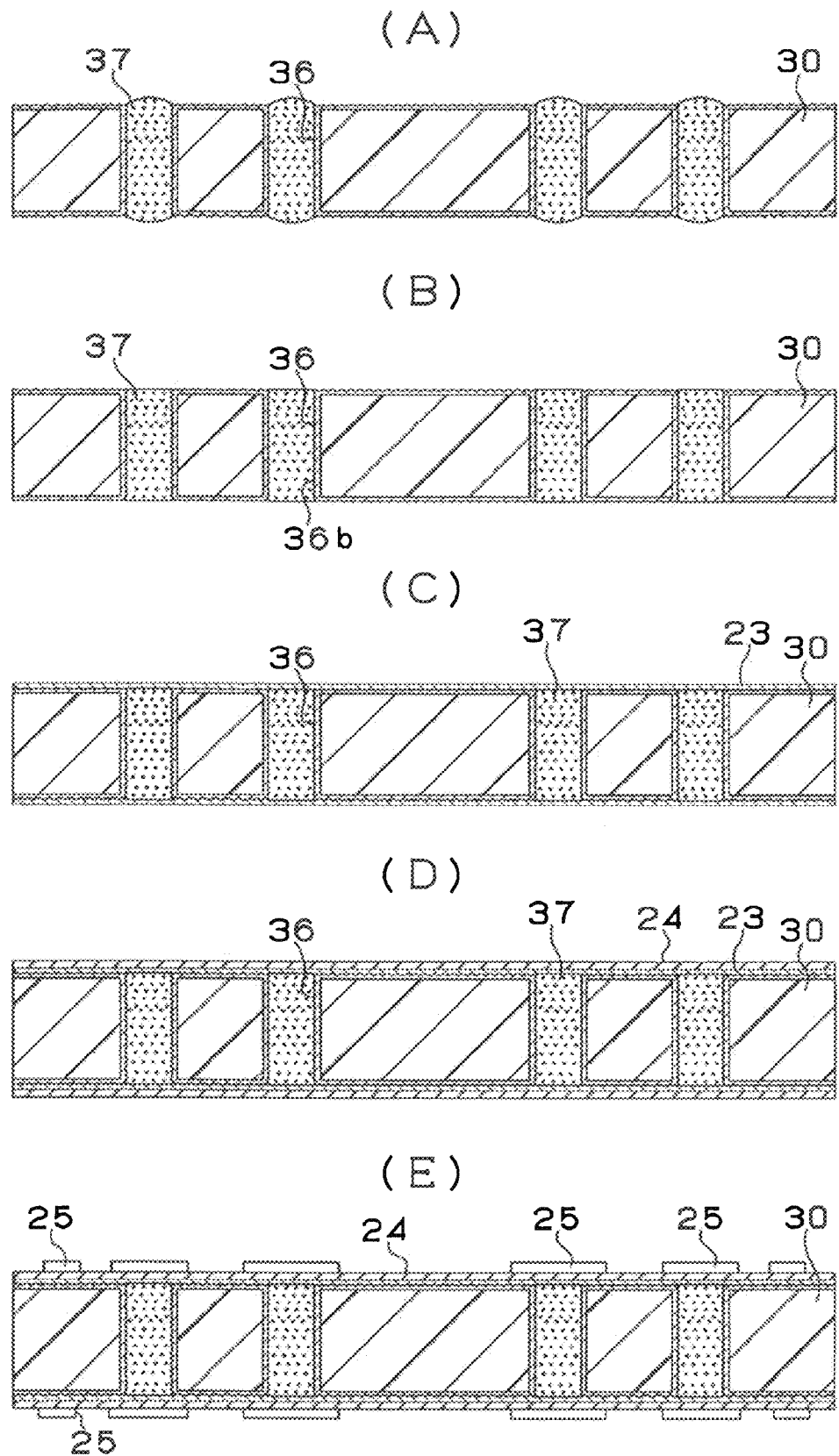
FIG. 2 shows views of a sequence of steps illustrating a method of manufacturing a multilayer printed wiring board according to an embodiment of the present invention.

Continuing on, the filler 37 which oozed out of the through holes 36 is removed by belt-sanding with the use of a #600 belt sanding paper (for example, sanding paper made by Sankyo Rikagaku Co., Ltd.), and further buffed to remove the flaws due to this belt-sanding to level the surfaces of substrate 30 (FIG. 2 (B)). In this manner, a substrate 30 in which the side wall conductor layers 36b of the through holes 36 and the resin filler 37 are effectively attached through the roughened layers 36α is obtained.

(4) A palladium catalyst is added to the surfaces of the substrate 30 leveled under the above-described step (3) which is electroless copper-plated to form electroless copper-plated films 23 of 0.6 μm in thickness (refer to FIG. 2 (C)).

(5) Then, an electrolytic copper plating is conducted under the following conditions to form electrolytic copper plated films 24 of 15 μm in thickness such that an added thickness for the portions to constitute conductor circuits 34 and the portions to constitute the cover plated layers (through-hole lands) covering the filler 37 filled in through holes 36 are formed (FIG. 2 (D)).

The aqueous solution for electrolytic plating includes:

| | |
|---|---|
| Sulfuric acid = | 180 g/l |
| Copper sulfate = | 80 g/l |
| Additive (made by Atotec Japan, Product name: Caparacid GL) = | 1 ml/l |

Conditions for electrolytic plating include:

| | |
|---|---|
| Current density = | 1 A/dm$^2$ |
| Time = | 70 minutes |
| Temperature = | Room temperature. |

(6) On both faces of the substrate 30 with the portions to constitute conductor circuits and cover plated layers formed thereon, a commercially available photosensitive dry film is attached, a mask is placed, which is exposed at 100 mJ/cm$^2$ and developed with 0.8% sodium carbonate to form etching resists 25 of 15 μm in thickness (refer to FIG. 2 (E)).

Figure 3:
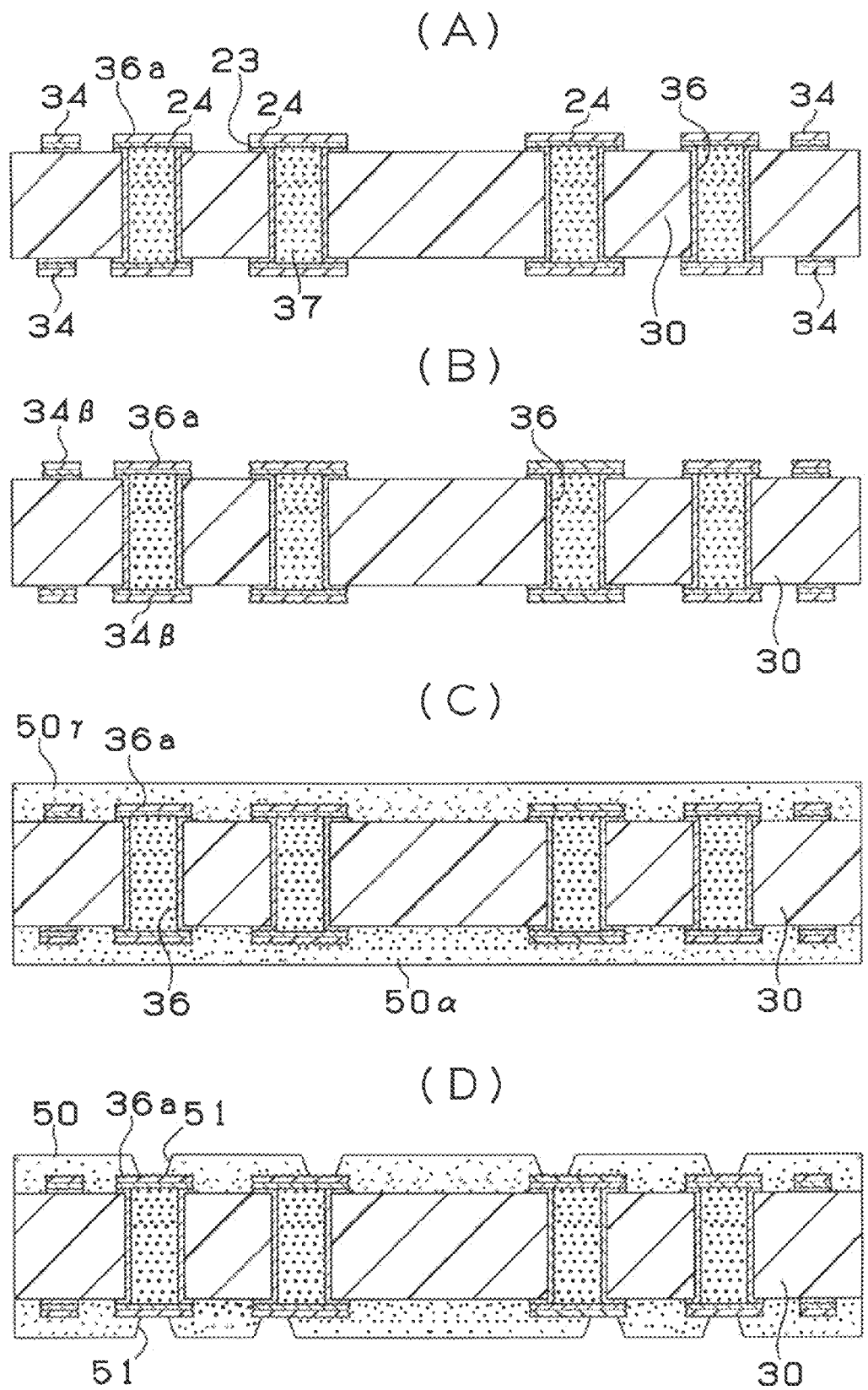
FIG. 3 shows views of a sequence of steps illustrating a method of manufacturing a multilayer printed wiring board according to an embodiment of the present invention.

(7) And, the plated films 23, 24 and the copper foils 32 at the portions where the etching resist 25 are not formed are dissolved and removed with an etching solution having cupric chloride as the main ingredient thereof, and, further, the etching resists 25 are stripped and removed with 5% KOH to form independent conductor circuits 34 and the cover plated layers 36a covering the filler 37 (refer to FIG. 3 (A)).

(8) Next, on the surfaces of the cover plated layer 36a covering the conductor circuits 34 and the filler 37 there a roughened layer (an uneven layer) 34β of 2.5 μm in thickness made of a Cu—Ni—P alloy is formed, and further, on the surface of this roughened layer 34β there an Sn layer of 0.3 μm in thickness is formed (refer to FIG. 3 (B), except, the Sn layer is not shown).

(9) On both faces of the substrate there is formed an interlayer resin insulating layer 50, after a resin film for interlayer resin insulating layer (for example, manufactured by Ajinomoto Co., Inc., Product Name: ABF-45SH) 50γ being slightly larger than the substrate being placed on the substrate and preliminarily pressure-bonded under the conditions of the pressure being 0.45 MPa, the temperature being 80° C., and the pressure-bonding time being 10 seconds and sheared, by being laminated with the use of a vacuum laminator by the following method (FIG. 3 (C)). Namely, the resin film for interlayer resin insulating layer is fully pressure-bonded under the conditions of the degree of vacuum being 67 Pa, the pressure being 0.47 MPa, the temperature being 85° C., and the pressure-bonding time being 60 seconds and subsequently thermoset at 170° C. for 40 minutes.

(10) Next, apertures for via holes 51 are formed in the interlayer resin insulating layers 50 with a $CO_2$ gas laser at the wavelength of 10.4 μm under the conditions of the beam diameter of 4.00 mm, a top hat mode, the pulse width of 3 to 30 μm, and 1 to 3 shots (FIG. 3 (D)).

Figure 4:
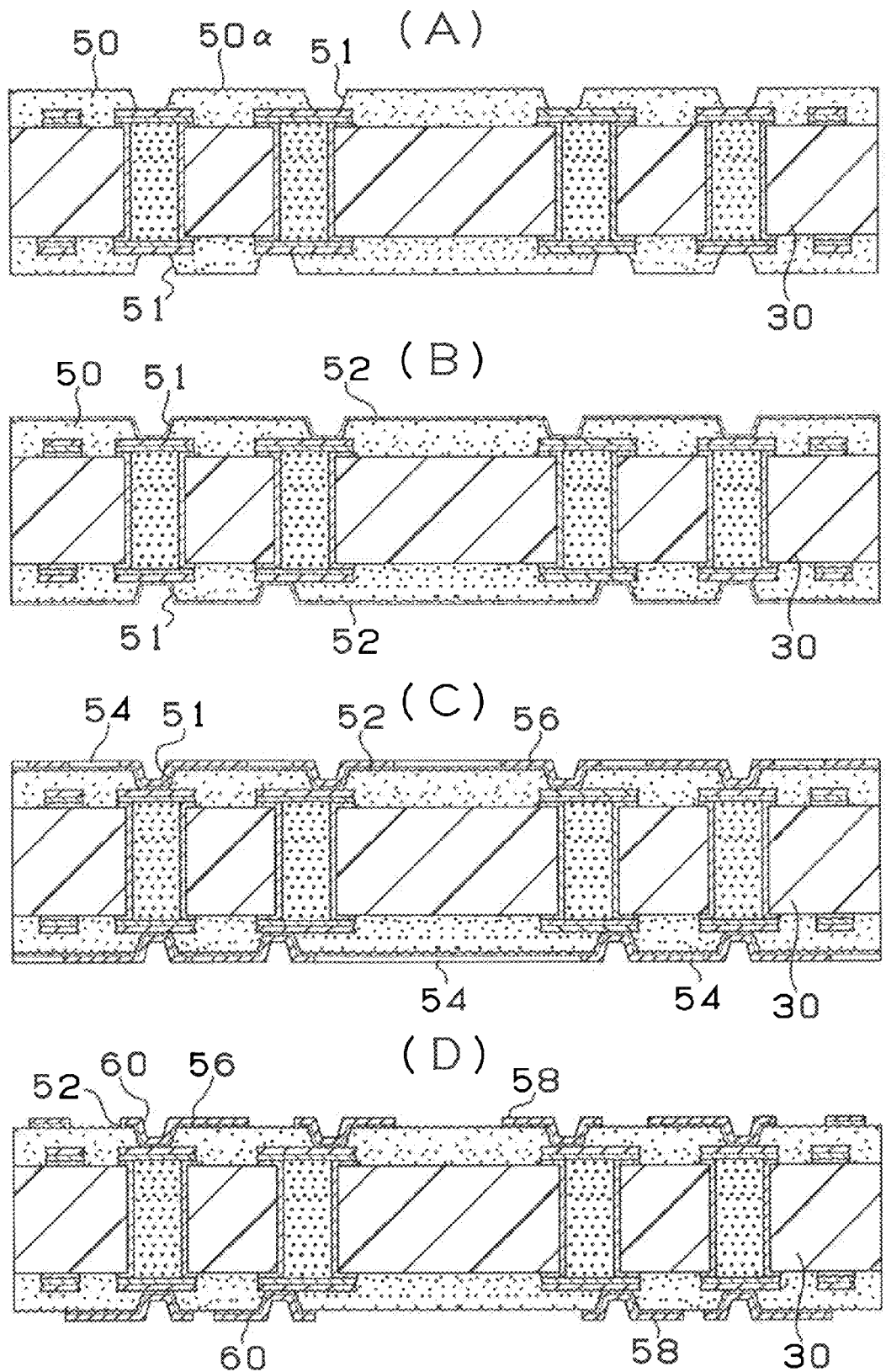
FIG. 4 shows views of a sequence of steps illustrating a method of manufacturing a multilayer printed wiring board according to an embodiment of the present invention.

(11) The substrate with the apertures 51 for via holes is immersed in a solution containing 60 g/l permanganic acid at 80° C. for 10 minutes to remove particles present on the surfaces of the interlayer resin insulating layers 50, such that roughened faces 50 are formed on the surfaces of the interlayer resin insulating layers 50 inclusive of the inner walls of the apertures for via holes 51 (FIG. 4 (A)).

(12) Next, the above-treated substrate is immersed in a neutralizing solution (for example, manufactured by Shipley Company, LLC) and then washed with water. Further, to the surfaces of said substrate which have been roughened (roughening depth being 3 μm) a palladium catalyst is added such that the catalyst nucleus is adhered to the surfaces of the interlayer resin insulating layers and the inner wall surfaces of the apertures for via holes. Namely, the above-described substrate is immersed in a catalyst solution containing palladium chloride ($PbCl_2$) and stannous chloride ($SnCl_2$) to allow palladium metal to precipitate and provide the catalyst.

(13) Next, the substrate provided with the catalyst is immersed in an electroless copper plating aqueous solution (for example, Thru-cup PEA manufactured by Uyemura Industries Co. Ltd.) to form an electroless copper plated film of 0.3 to 3.0 μm in thickness over the entire roughened surfaces, to obtain a substrate wherein electroless copper plated films are formed on the surfaces of the interlayer resin insulating layers 50, inclusive of the inner walls of the apertures for via holes 51 (FIG. 4 (B)). Conditions for electroless plating are 34° C. solution temperature for 45 minutes.

(14) Commercially available photosensitive dry films are attached to the substrate on which electroless copper plated films 52 had been formed and a mask was placed, which was exposed at 110 mJ/cm² and developed with 0.8% sodium carbonate aqueous solution to provide plating resists 54 of 25 μm in thickness. Then, the substrate is washed with water at 50° C. to remove grease, and then it is washed with water at 25° C. and further washed with sulfuric acid and subsequently it is electroplated under the following conditions to form electrolytic copper plated film 56 of 15 μm in thickness on the portions where the plating resists 54 had not been formed (FIG. 4 (C)).

Electrolytic plating solution includes:

| | |
|---|---|
| Sulfuric acid | 2.24 mol/l |
| Copper sulfate | 0.26 mol/l |
| Additive | 19.5 mol/l (for example, manufactured by Atotech Japan, Product Name: Caparacid GL) |

Electrolytic plating conditions include:

| | |
|---|---|
| Current density | 1 A/dm² |
| Time | 70 minutes |
| Temperature | 22 ± 2° C. |

(15) Further, after the plating resists 54 have been stripped and removed with 5% KOH, the electroless plating films below the plating resists are dissolved and removed by an etching process with a mixture solution of sulfuric acid and hydrogen peroxide to constitute independent conductor circuits 58 and via holes 60 (FIG. 4 (D)).

(16) Then, the similar processing as in the above-described (4) is conducted to from roughened faces 58α on the surfaces of the conductor circuits 58 and via holes 60. The thickness of the lower layer conductor circuit 58 is 15 μm (FIG. 5 (A)). The lower layer conductor circuit may be formed as having the thickness over the range of 5 to 25 μm.

Figure 5:
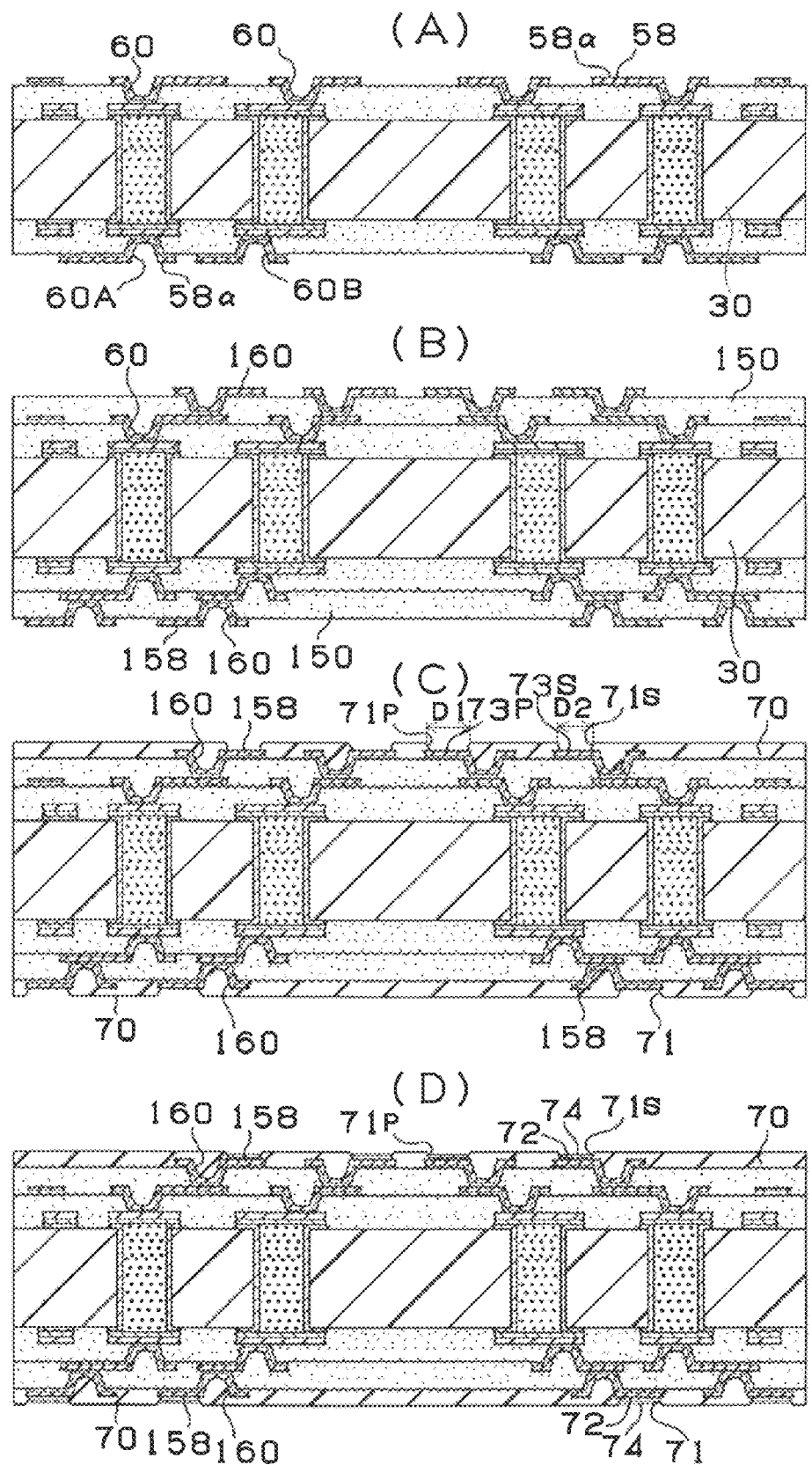
FIG. 5 shows views of a sequence of steps illustrating a method of manufacturing a multilayer printed wiring board according to an embodiment of the present invention.

(17) By repeating the above-mentioned steps (9) through (16), an interlayer insulating layer 150 having upper layer conductor circuits 158 and via holes 160 is further formed to obtain a multilayer wiring board (FIG. 5 (B)).

(18) Next, a commercially available solder-resist (or solder-mask) composition 70 is coated in a thickness of 20 μm on both faces of the multilayer wiring substrate, and then it is dried for 20 minutes at 70° C. and then for 30 minutes at 70° C. Then, a photo mask of 5 mm thickness on which a pattern of the aperture portion of the solder-resist is drawn is tightly adhered to the solder-resist layer 70, after the solder-resist layer 70 was exposed to an ultraviolet ray of 1,000 mJ/cm² and developed with a DMTG solution to form large-diameter (D1=105 μm) apertures 71P and small-diameter (D2=80 μm) apertures 71S on the upper face side, and apertures 71 of 200 μm in diameter on the lower face side, and large-diameter pads 73P formed by a portion of the conductor circuits 158 exposed in the large-diameter apertures 71P and the small-diameter pads 73S formed by a portion of the conductor circuits 158 exposed in the small-diameter apertures 71S (FIG. 5 (C)).

Further, the solder-resist layers are hardened by heat processes under the conditions of for one hour at 80° C., for one hour at 100° C., for one hour at 120° C., and for three hours at 150° C. to form solder-resist pattern layers of 15 to 25 μm in thickness having apertures.

(19) Next, the substrate on which solder-resist layers 70 is formed is immersed in an electroless nickel plating solution at pH=4.5 and containing nickel chloride ($2.3 \times 10^{-1}$ mol/l), sodium hypophosphite ($2.8 \times 10^{-1}$ mol/l), and sodium citrate ($1.6 \times 10^{-1}$ mol/l) for 20 minutes to form nickel plated layer 72 of about 5 μm in thickness in the aperture areas 71, 71S, and 71P. Furthermore, the substrate is immersed in an electroless gold plating solution containing potassium gold cyanide ($7.6 \times 10^{-3}$ mol/l), ammonium chloride ($1.9 \times 10^{-1}$ mol/l), sodium citrate ($1.2 \times 10^{-1}$ mol/l), and sodium hypophosphite ($1.7 \times 10^{-1}$ mol/l) under the conditions of for 7.5 minutes at 80° C. to form a gold plated layer 74 of about 0.03 μm in thickness on the nickel plated layer 72 (FIG. 5 (D)). Besides a nickel-gold layer, a single layer of tin or a precious metal (gold, silver, palladium, platinum, etc.) may be formed. Further, a conductive pad may be formed without adding metal layers.

(20) A process to mount a solder ball.

Continuing on, a process of loading solder balls onto the multilayer printed wiring board 10 with the solder ball loading apparatus 100 described above with reference to FIG. 14 will be described with reference to FIG. 6 through FIG. 8.

(I) Position Recognition and Correction of the Multilayer Printed Wiring Board.

Figure 6:
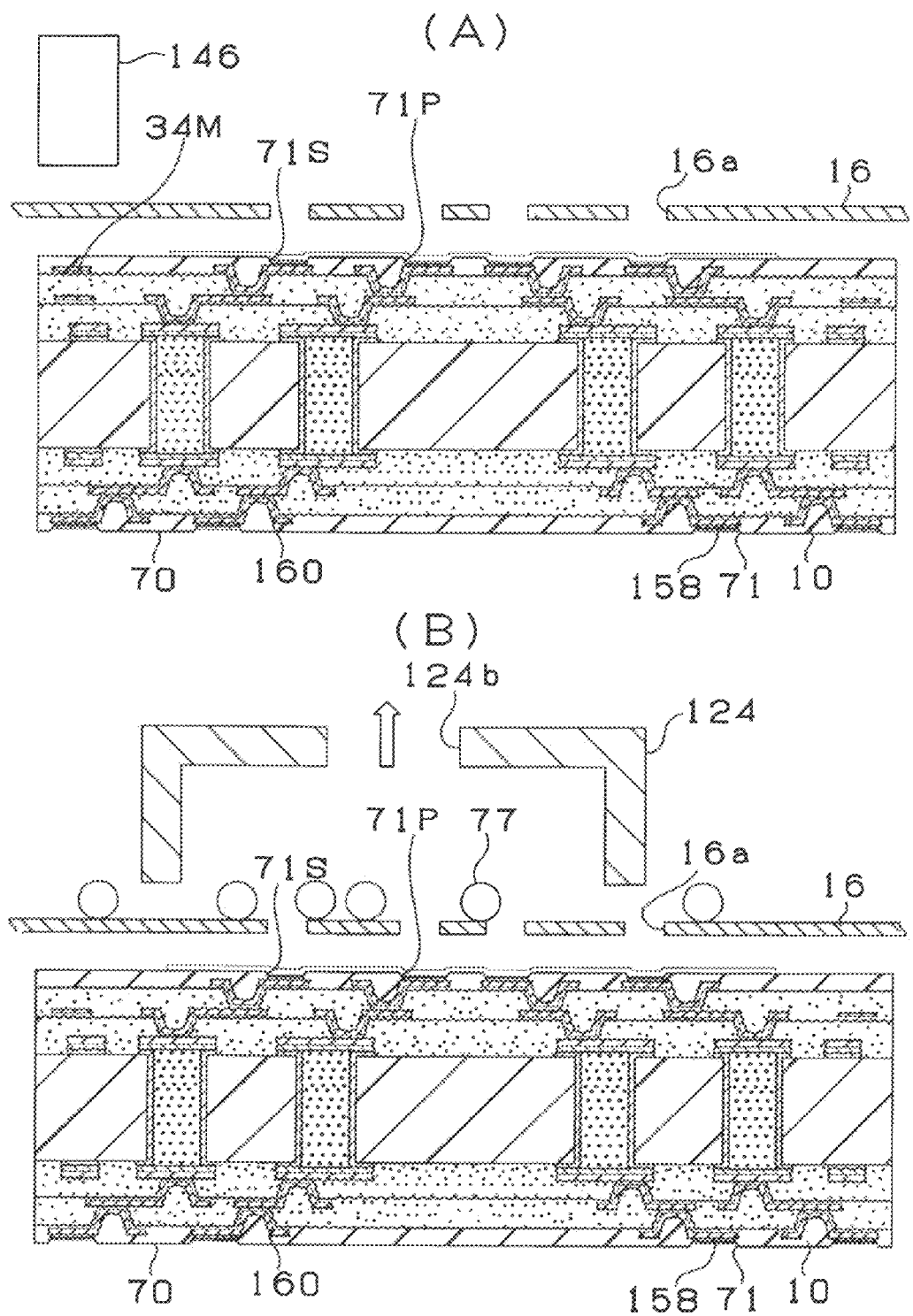
FIG. 6 shows views of a sequence of steps illustrating a method of manufacturing a multilayer printed wiring board according to an embodiment of the present invention.

The alignment mark 34M of the multilayer printed wiring board 10 is recognized with the alignment camera 146, as illustrated in FIG. 6 (A), such that the position of the multilayer printed wiring board 10 with respect to the ball arrangement mask 16 is corrected with the XYθ suction table 114. In other words, the position is adjusted such that each of the apertures 16a of the ball arrangement mask 16 corresponds to each of the small-diameter apertures 71S and the large-diameter apertures 71P of the multilayer printed wiring board 10.

(II) Feeding of Solder Balls.

As shown in FIG. 6 (B), the solder balls 77 (75 µm in diameter, Sn63Pb37 (for example, manufactured by Hitachi Metals, Ltd.)) are supplied in a specified quantity from the solder ball supply unit 122 to the side of a plurality of loading cylinders 124. In addition, they may in advance be supplied to be stored in a loading cylinder. While Sn/Pb solder balls are used for solder balls in this example, Pb-free solder balls selected from a group of Sn and Ag, Cu, In, Bi, Zn, etc. can be used.

(III) Loading of Solder Balls.

Figure 7:
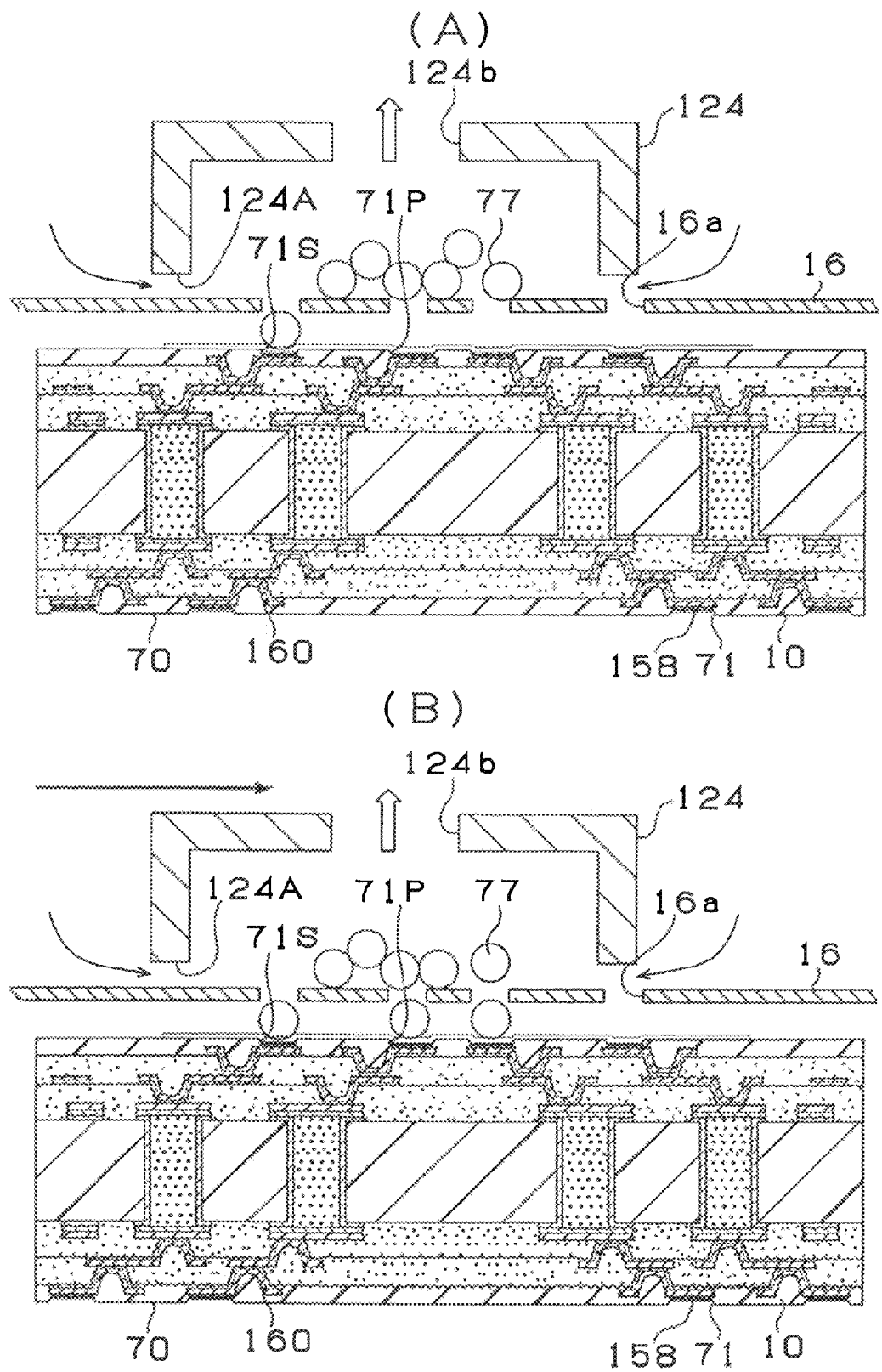
FIG. 7 shows views of a sequence of steps illustrating a method of manufacturing a multilayer printed wiring board according to an embodiment of the present invention.

The loading cylinders 124 are positioned above the ball arrangement mask 16 while maintaining a predetermined clearance (for example, 0.5 to 4 times the ball diameter) to the ball arrangement mask, as illustrated in FIG. 7 (A), and air is suctioned from the suction portion 124b such that the flow velocity at the gap between the loading cylinder and the printed wiring board is set to 5 m/sec to 35 m/sec to allow the solder balls 77 to gather on the ball arrangement mask 16 directly below the aperture portion 124A of said loading cylinder 124.

Subsequently, the loading cylinders 124 lined up along the Y axis of the multilayer wiring board 10 as illustrated in FIG. 7 (B) and FIG. 8 (A) as well as FIG. 14 (B) and FIG. 14 (A) are moved in a horizontal direction along the X axis via the X-direction moving shaft 140. This causes the solder balls 77 gathered on the ball arrangement mask 16 to be moved with the movement of the loading cylinders 124, such that they are dropped via the apertures 16a of the ball arrangement mask 16 and loaded into the small-diameter apertures 71S and the large-diameter apertures 71P of the multilayer printed wiring board 10. The solder balls 77 are successively arranged on all the connection pads on the side of the multilayer printed wiring board 10.

While the loading cylinders 124 are moved, it is possible, instead, to move the multilayer printed wiring board 10 and the ball arrangement mask 16 with the loading cylinders 124 held stationary such that the solder balls 77 gathered directly below the loading cylinders 124 are loaded into the small-diameter apertures 71S and the large-diameter apertures 71P of the multilayer printed wiring board 10 via the apertures 16a of the ball arrangement mask 16.

(IV) Removal of Excess Solder Balls.

As illustrated in FIG. 8 (B), the excess solder balls 77 are guided by the loading cylinders 124 to the locations where there are no apertures 16a on the ball arrangement mask 16 to suction out and remove them with the ball removal cylinder 161.

Figure 9:
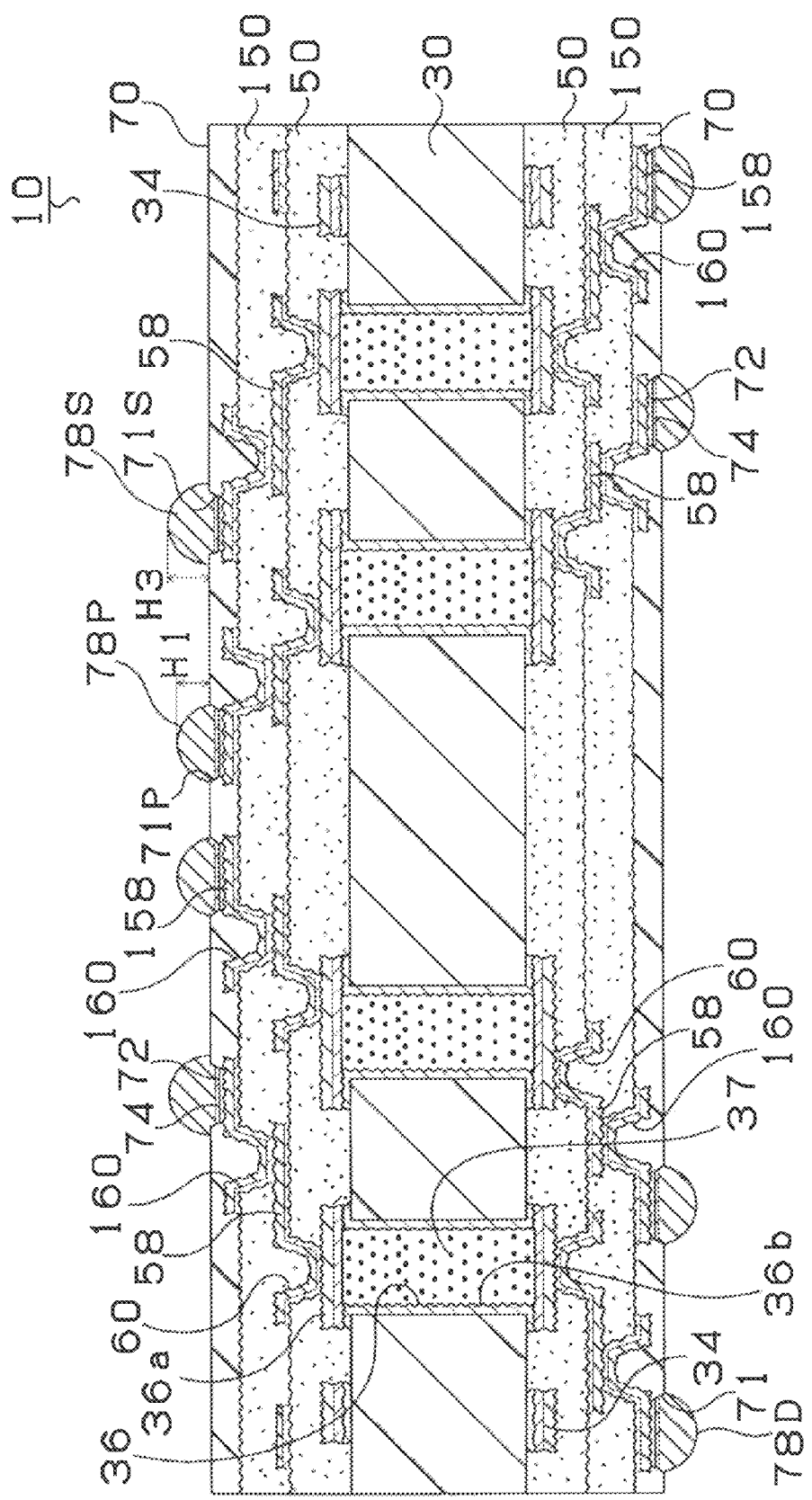
FIG. 9 is a cross-sectional view of a multilayered printed wiring board related to an embodiment of the present invention.

(21) Then, the solder balls 77 on the upper face are melted by reflow at 230° C. to form large-diameter aperture solder bumps 78P having a low height (H1≈30 µm, the height protruding out of the surface of the solder-resist) out of the solder balls 77 in the large-diameter apertures 71P, and small-diameter aperture solder bumps 78S having a high height (H3≈40 µm, the height protruding out of the surface of the solder-resist) out of the solder balls 77 in the small-diameter apertures 71S and solder bumps 78D on the lower face (FIG. 9).

Figure 10:
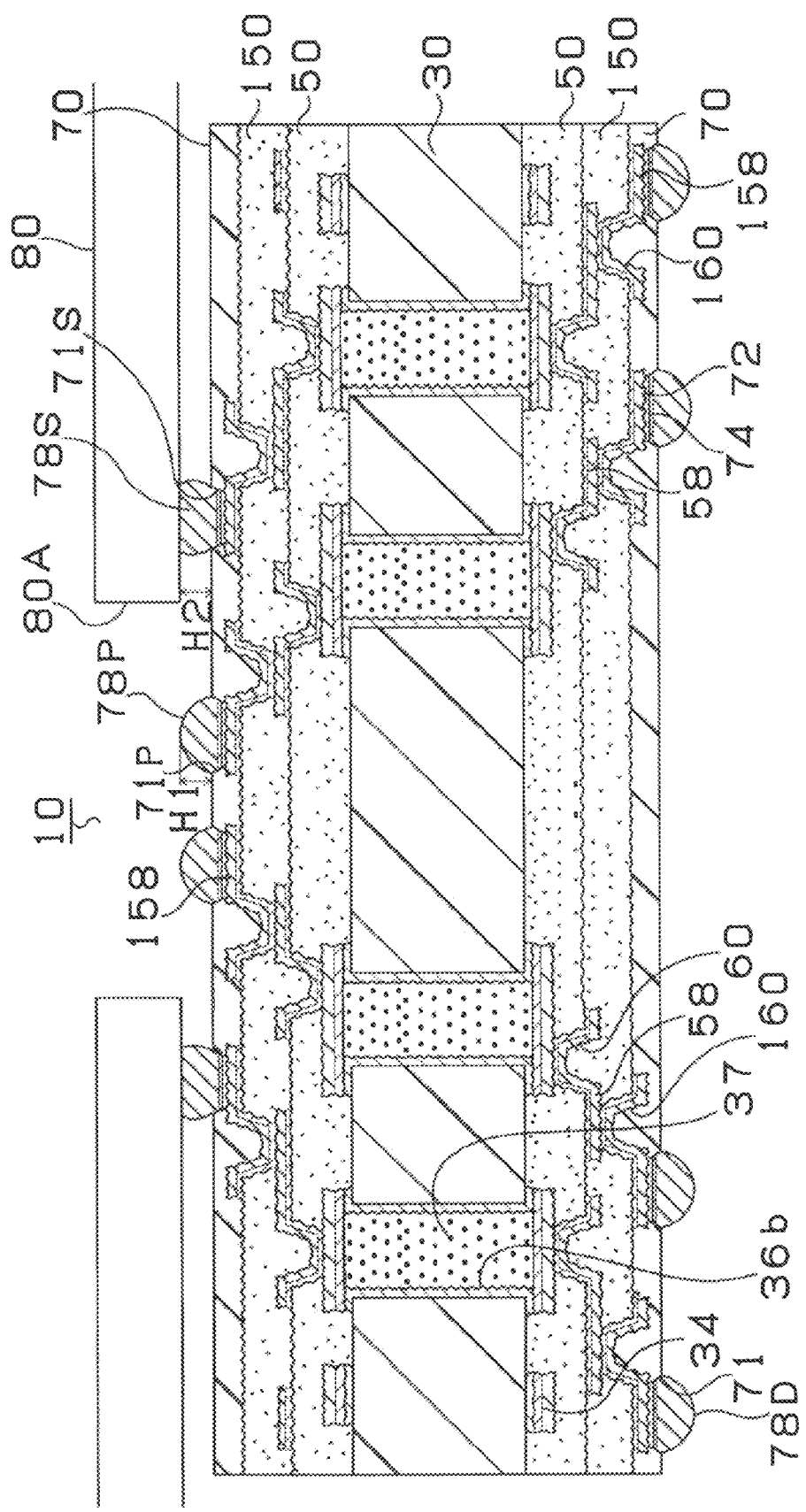
FIG. 10 is a cross-sectional view of a multilayered printed wiring board related to an embodiment of the present invention with a flat plate applied to solder bumps.
Figure 11:
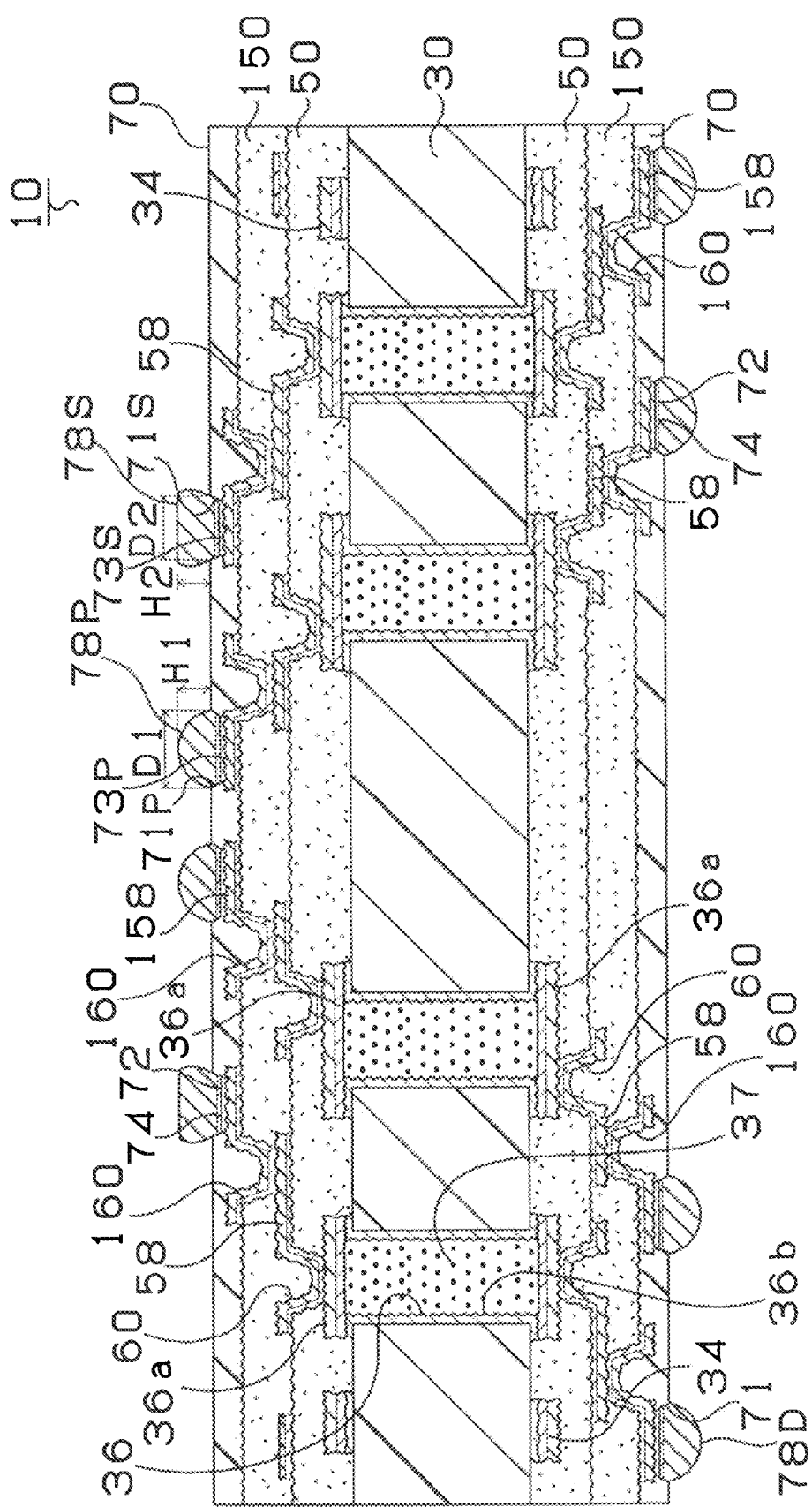
FIG. 11 is a cross-sectional view of a multilayered printed wiring board related to an embodiment of the present invention.

(22) Then, as shown in FIG. 10, the solder bumps having a high height 78S in the small-diameter apertures 71S are flattened by a flat plate 80 having an aperture 80A at the position corresponding to the large-diameter aperture solder bump portion being pressed on such that it is brought to the same height (H2≈30 µm) as the height (H1≈30 µm) of the solder bumps 78P in the large-diameter apertures 71P (FIG. 11). The flat plate 80 may be heated.

In accordance with an embodiment of the invention, the solder bumps in small-diameter apertures 71S, being disposed mainly on the outer side of the large-diameter apertures 71P, which are on the center side, are flattened with the flat plate 80 having an aperture 80A corresponding to the positions at which the large-diameter apertures 71P are disposed. This results in solder bumps 78S in the small-diameter apertures 71S having the approximate height of the solder bumps 78P in the large-diameter apertures 71P with the same volume.

Thus the IC chip 90 is loaded onto the multilayer printed wiring board 10, and by reflow the connections pads of the printed wiring board and the electrodes of the IC chip are connected via the solder bumps 78P and 78S. At that juncture, since the solder amount of the solder bumps 78S in the small-diameter apertures 71S is the same as that of the solder bumps 78P in the large-diameter apertures 71P, no non-connection occurs at the solder bumps 78S in the small-diameter apertures 71S, allowing the connection reliability between the IC chip 90 and the multilayer printed wiring board 10 to be ensured. Subsequently, the multilayer printed wiring board 10 is attached to a daughter board 94 via solder bumps 78D (FIG. 12).

In accordance with an embodiment of the invention, by the solder bumps having a high height 78S in the small-diameter apertures 71S being flattened, the solder bumps 78S will result in solder bumps formed roughly at the same height as solder bumps 78P formed in large-diameter apertures 71P, even if the small aperture diameter varies. Thus, the mounting yield of the IC chip can be enhanced and an improvement of the connection reliability between the IC chip 90 and the multilayer printed wiring board 10 becomes possible.

Further, in accordance an embodiment of the invention, because the solder bumps for power supply and ground 78P in the large-diameter apertures 71P are not flattened and maintain a semi-spherical shape, voids are easily let out during reflow when the IC chip is loaded, preventing the occurrence of voids due to air inside the solder bumps. This prevents high resistance connections, and is highly advantageous for a power supply connection.

According to an embodiment of the invention, with the loading cylinders 124 positioned above the ball arrangement mask 16, the solder balls 77 are gathered directly below the loading cylinders 124 by air being suctioned out of said loading cylinders 124. The solder balls 77 are moved over the ball arrangement mask 16 by the movement of the loading cylinders 124, or by the movement of the ball arrangement mask 16 while the loading cylinders 124 are held still. The solder balls 77 are dropped into the small-diameter apertures 71S and the large-diameter apertures 71P of the multilayer printed wiring board 10 via the apertures 16a of the ball arrangement mask 16. This allows with certainty fine solder balls 77 to be loaded into all of the small-diameter apertures 71S and large-diameter apertures 71P of the multilayer printed wiring board 10. And, since the solder balls are moved without touching a mechanical movement part such as a squeegee, the solder balls can be loaded into the small-diameter apertures 71S and large-diameter apertures 71P without being damaged or deformed, resulting in an even height of the solder bumps 78S and 78P, unlike the case where a squeegee is used. Further, since the solder balls are guided by suction force, the aggregation and adhesion of solder balls can be prevented. Since they present themselves as solder bumps of a large volume having a uniform height, they present themselves as, not only having a high cold and heat shock resistance, but also having low resistance solder bumps which are advantageous for power supply.

In accordance an embodiment of the invention, the height of small-diameter solder bumps 78S and the height of the large-diameter solder bumps 78P are set to the same 30 μm. It becomes difficult to ensure no non-connection bumps if the difference in height is greater than 10 μm.

Figure 15:
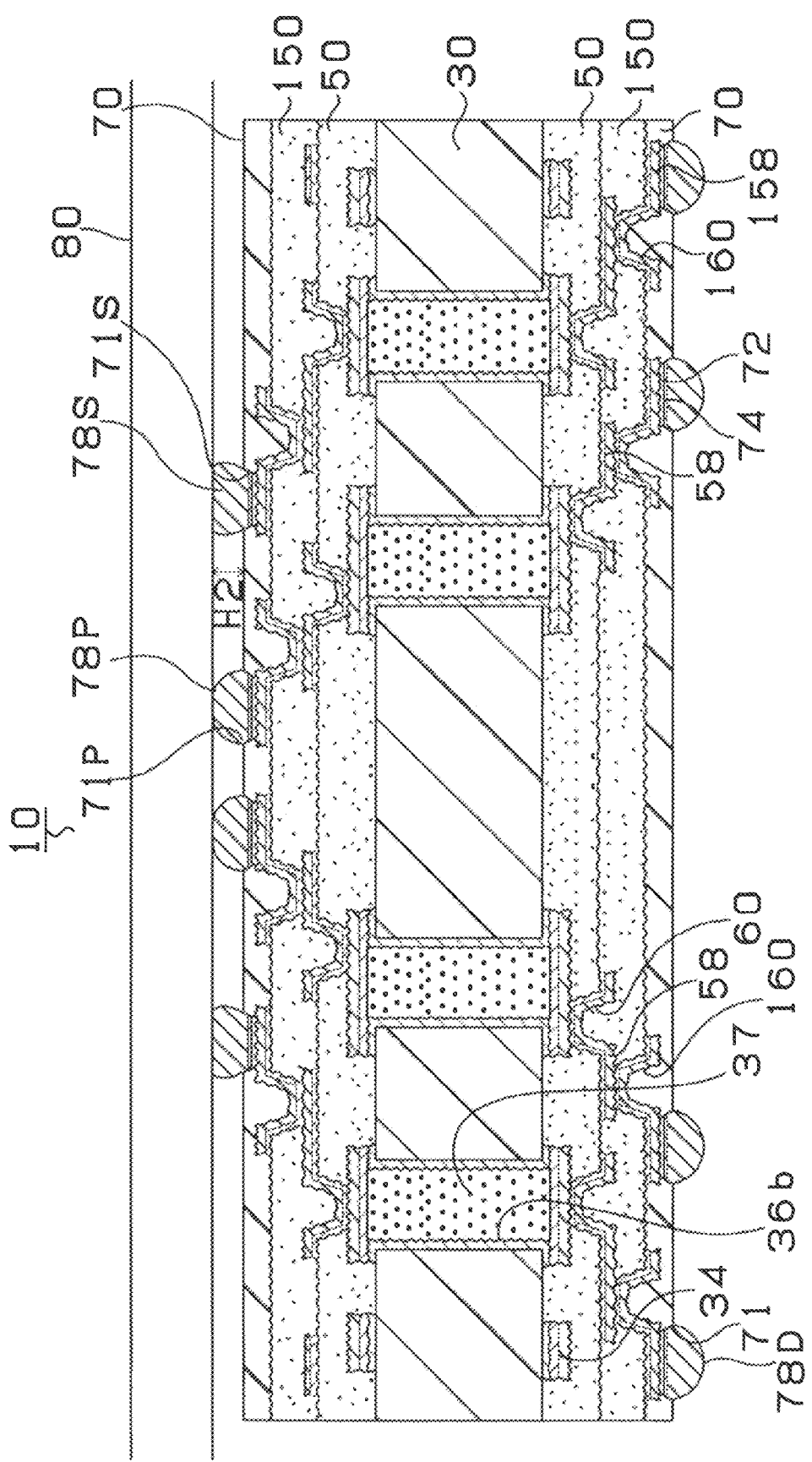
FIG. 15 is a cross-sectional view of a multilayered printed wiring board related to an embodiment of the present invention.

Continuing on, a multilayer printed wiring board and a method of manufacturing the multilayer printed wiring board pertaining to another embodiment of the present invention will be described with reference to FIG. 15 and FIG. 16.

As described above with reference to FIG. 10 and FIG. 11, only the small-diameter solder bumps having a high height 78S were flattened. In accordance with another embodiment of the invention, as illustrated in FIG. 15, the large-diameter solder bumps having a low height 78P are also flattened. The large-diameter solder bumps formed in the large-diameter (D1=105 μm) apertures 71P and the small-diameter solder bumps 78S having a high height formed in the small-diameter (D2=80 μm) apertures 71S are pressed with the flat plate 80. The solder bumps 78S having a high height in the small-diameter apertures 71S and the solder bumps 78P in the large-diameter apertures 71P are flattened such that the heights (H2≈30 μm) are the same (FIG. 11). In addition, the solder bumps 78S and the solder bumps 78P are formed out of solder balls having the same diameter and have the same volume.

Figure 16:
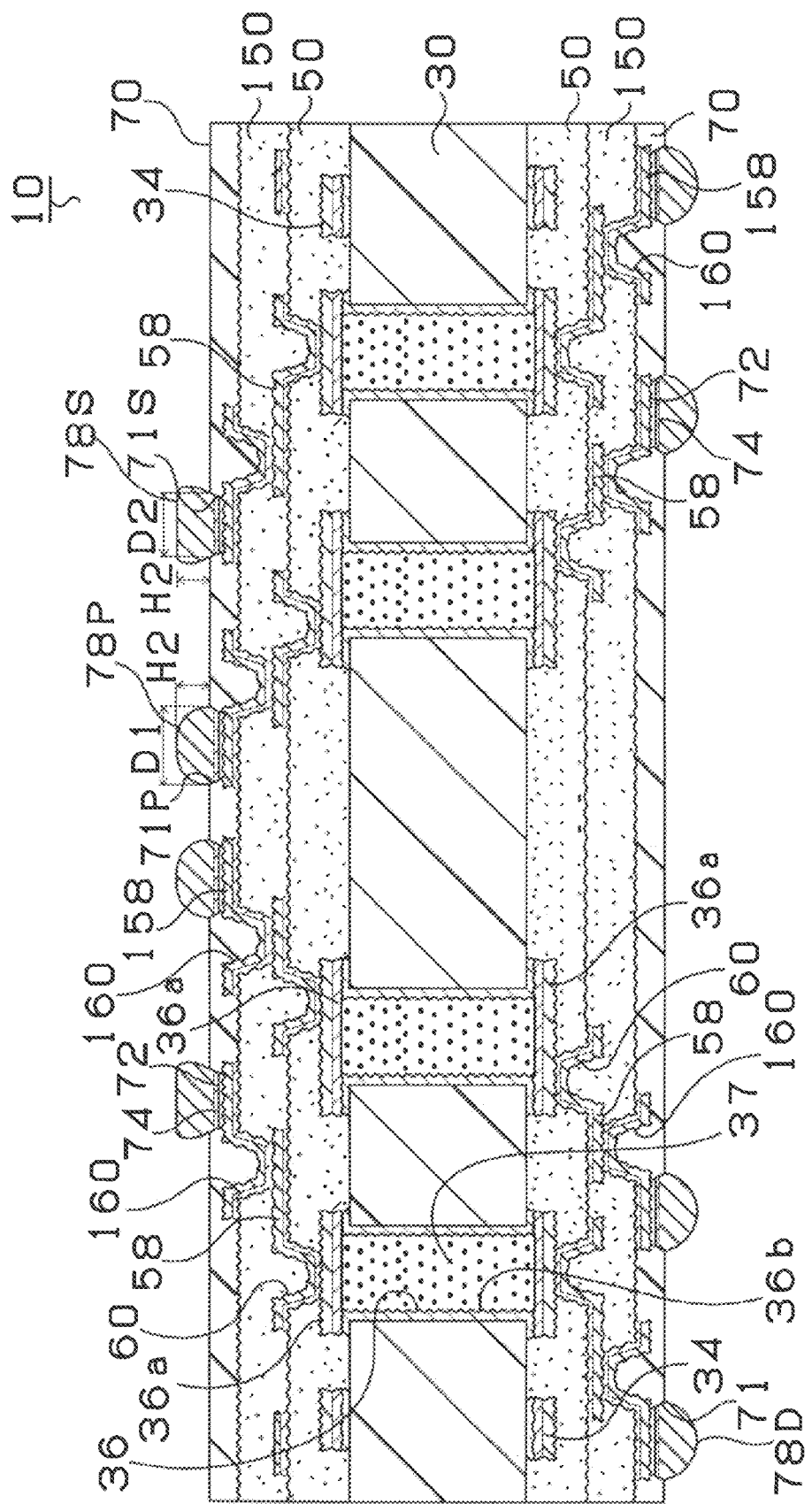
FIG. 16 is a cross-sectional view of a multilayered printed wiring board related to an embodiment of the present invention.

As shown in FIG. 16, the solder bumps 78S in the small-diameter apertures 71S are flattened as a whole and the large-diameter solder bumps 78P are flattened at the top only. In accordance to this embodiment, the height of all the solder bumps can advantageously be set uniformly to a desired height.

The invention claimed is:

1. A method of manufacturing a printed wiring board having bumps, comprising:
   forming a solder-resist layer having a small-diameter aperture and a large-diameter aperture, each aperture exposing a respective conductive pad of the printed wiring board;
   loading a solder ball in each of the small-diameter aperture and the large-diameter aperture using a mask having aperture areas that correspond to the small-diameter aperture and the large-diameter aperture of said solder-resist layer;
   forming a first bump, having a first height, from said solder ball in the small-diameter aperture;
   forming a second bump, having a second height, from said solder ball in the large-diameter aperture, the first height being greater than the second height; and
   pressing a top of the first bump in the small-diameter aperture such that the first height of the first bump becomes substantially the same as the second height of the second bump,
   wherein the pressing is performed by a flat plate that is heated.

2. The method according to claim 1, further comprising applying a flux to the small diameter aperture before loading a solder ball therein.

3. The method according to claim 2, wherein the loading comprises:
   positioning a cylinder member having an aperture area that faces an upper side of the mask;
   gathering multiple solder balls on the mask immediately below the cylinder member by inrushing air to the aperture area of the cylinder member; and
   loading one of the gathered solder balls in the small-diameter aperture and the large-diameter aperture in the solder-resist layer through the aperture areas of the mask by moving the cylinder member relative to the mask.

4. The method according to claim 1, further comprising:
   applying a flux to the large diameter aperture before mounting the metal ball therein.

5. The method according to claim 4, wherein the loading comprises:
   positioning a cylinder member having an aperture area that faces an upper side of the mask;
   gathering multiple solder balls on the mask immediately below the cylinder member by inrushing air to the aperture area of the cylinder member; and
   loading one of the gathered solder balls in the small-diameter aperture and the large diameter aperture in the solder-resist layer through the aperture areas of the mask by moving the cylinder member relative to the mask.

6. The method according to claim 1, wherein the second height is approximately 30 μm.

7. The method according to claim 1, wherein the forming comprises forming a large-diameter aperture that is approximately 105 μm.

8. The method according to claim 1, wherein the forming comprises forming a small-diameter aperture that is approximately 80 μm.

9. The method according to claim 1, wherein the bump in the large-diameter aperture is positioned in a center region of the printed wiring board.

10. The method according to claim 1, wherein the bump in the small-diameter aperture is positioned in a periphery region of the printed wiring board.

11. The method according to claim 1, further comprising:
    removing redundant metal balls, that are not aligned in an aperture, from the mask by suction.

12. A method of manufacturing a printed wiring board having bumps, comprising:
    forming a solder-resist layer having a small-diameter aperture and a large-diameter aperture, each aperture exposing a respective conductive pad of the printed wiring board;
    loading only a single solder ball in each respective one of the small-diameter aperture and the large-diameter aperture using a mask having aperture areas that correspond to the small-diameter aperture and the large-diameter aperture of said solder-resist layer;
    forming a first bump, having a first height, from said solder ball in the small-diameter aperture;
    forming a second bump, having a second height, from said solder ball in the large-diameter aperture, the first height being greater than the second height; and
    pressing a top of the first bump in the small-diameter aperture such that the first height of the first bump becomes substantially the same as the second height of the second bump, wherein the loading comprises:
    positioning a cylinder member having an aperture area that faces an upper side of the mask;
    gathering multiple solder balls on the mask immediately below the cylinder member by inrushing air to the aperture area of the cylinder member; and
    loading one of the gathered solder balls in the small-diameter aperture and the large-diameter aperture in the solder-resist layer through the aperture areas of the mask by moving the mask and the printed wiring board relative to the cylinder member.

13. The method according to claim 12, further comprising:
removing redundant solder balls that are not aligned in an aperture area of the mask, from the mask by suction.

14. The method according to claim 12, further comprising:
pressing a top of the second bump in the large-diameter aperture such that the height of the second bump in the large-diameter aperture is at a desirable level relative to a surface of the printed wiring board.

15. A method of manufacturing a printed wiring board having bumps, comprising:
forming a solder-resist layer having a small-diameter aperture and a large-diameter aperture, each aperture exposing a respective conductive pad of the printed wiring board;
loading a solder ball in each of the small-diameter aperture and the large-diameter aperture using a mask having aperture areas that correspond to the small-diameter aperture and the large-diameter aperture of said solder-resist layer;
forming a first bump, having a first height, from said solder ball in the small-diameter aperture;
forming a second bump, having a second height, from said solder ball in the large-diameter aperture, the first height being greater than the second height;
pressing a top of the first bump in the small-diameter aperture such that the first height of the first bump becomes substantially the same as the second height of the second bump, and
removing redundant solder balls that are not aligned in an aperture, from the mask by suction.

16. The method according to claim 15,
wherein the pressing is performed by a flat plate that is heated.

* * * * *